(12) United States Patent
Takano et al.

(10) Patent No.: US 6,950,341 B2
(45) Date of Patent: Sep. 27, 2005

(54) SEMICONDUCTOR MEMORY DEVICE HAVING PLURAL SENSE AMPLIFIERS

(75) Inventors: Yoshinori Takano, Ichikawa (JP); Kentaro Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 407 days.

(21) Appl. No.: 10/119,840

(22) Filed: Apr. 11, 2002

(65) Prior Publication Data

US 2002/0186593 A1 Dec. 12, 2002

(30) Foreign Application Priority Data

Jun. 7, 2001 (JP) ...................................... 2001-172855
Jun. 7, 2001 (JP) ...................................... 2001-172856

(51) Int. Cl.[7] ............................ G11C 16/06; G11C 7/00
(52) U.S. Cl. ............................. 365/185.21; 365/189.08; 365/196
(58) Field of Search .......................... 365/185.21, 196, 365/210, 207, 189.09, 205

(56) References Cited

U.S. PATENT DOCUMENTS 5,023,839 A * 6/1991 Suzuki et al. .......... 365/185.21
5,642,308 A * 6/1997 Yoshida ................ 365/185.12
6,404,666 B1 * 6/2002 Uchida ...................... 365/104

FOREIGN PATENT DOCUMENTS

JP     2000-048585     2/2000
JP     2001-143485     5/2001

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory device is disclosed which includes an array of memory cells for storing data depending on whether current pull-in is present or absent or alternatively whether it is large or small, a plurality of sense lines with read data of the memory cell array transferred thereto, a reference sense line for common use in data sensing at the plurality of sense lines while being given a reference voltage for the data sense, and a sense amplifier array having a plurality of sense amplifiers for amplifying a difference voltage between the plurality of sense lines and the reference sense line to thereby determine read data.

42 Claims, 24 Drawing Sheets

SEMICONDUCTOR MEMORY DEVICE HAVING PLURAL SENSE AMPLIFIERS

CROSS-REFERENCE TO RELATED APPLICATIONS

This application is based on and claims the benefit of priority from prior Japanese Patent Application No. 2001-172855, filed on Jun. 7, 2001 and also JPA No. 2001-172856, filed Jun. 7, 2001, the entire contents of which are incorporated herein by reference.

BACKGROUND OF THE INVENTION

1. Field of the Invention

This invention relates generally to semiconductor memory devices performing data storage based on whether current pull-in is present or absent or alternatively whether it is large or small in intensity. More particularly but not exclusively, the invention relates to improvements in sense amplifier circuit schemes for performing data sensing by comparison of a voltage potential on a data line to that on a reference data line.

2. Description of Related Art

Currently available semiconductor memory device include non-volatile data storable memory devices such as electrically erasable and programmable read-only memory (EEPROM) chips with nonvolatile data storing functionalities while offering electrical reprogramming capabilities. EEPROMs in turn include ones of the type erasing a plurality of memory cells at a time, which are called "flash" memories among those skilled in the art. In the flash memories, data is stored in a memory cell as a threshold voltage change accomplished by injection or extraction electrical charge carriers at its floating gate. A logical value of the stored data is determinable by detecting whether cell current pull-in is present or absent or, alternatively, whether it is large or small in intensity. To do this, flash memories are typically designed to employ sense amplifier circuit of the current-sensing type. Most current-sensing type sense amplifier circuits make use of schemes for reading data through comparison of a voltage potential on a data line to a predetermined reference voltage on a reference data line.

One prior known sense amplifier circuit using such schemes is shown in FIG. 32. This circuit is formed of a differential amplifier 101 for use as a "core" circuit thereof. The differential amplifier 101 has input terminals, one of which is connected to a sense line SN and the other of which is to a reference sense line RSN. Sense line SN is coupled to a current-source load 102 whereas reference sense line RSN is to its own current-source load 201. Sense line SN and reference sense line RSN are connected through separation (clamping) circuits 105, 202 to a data line DL and a reference data line RDL, respectively.

Data is read out of a memory cell MC onto the data line DL. More practically in the case of large-capacity flash memory chips, the data of memory cell MC is read through a multiple-stage selection route in a way which follows: the data is first read onto a local bit line BL and is then transferred via a first column gate 103 to a main bit line MBL and further sent to the data line DL through a second column gate 104. The reference data line RDL is operatively associated with a current source 203 connected thereto. Current source 203 has a current value which is set midway between a cell current expected to flow when the memory cell MC's data is a logic "0" and a cell current flowing when the data is a logic "1." Connected to current source 203 is a dummy data line capacitor CR which is for establishment of a capacitive balance relative to data line DL.

An ensemble of the current-source load 201 on the reference sense line RSN side and the separator circuit 202 plus the reference sense line RSN makes up a reference voltage generation circuit 200 that is operable to generate a reference voltage for detection of a voltage of cell data being sent to the sense line SN.

The data line DL has a large load. Thus, it is required for high-speed sensing operations to perform data detection while suppressing the amplitude or "swing width" of a voltage on such data line DL. To this end, a clamping circuit 105 is provided between data line DL and sense line SN for suppressing the voltage swing width on data line DL. Using this clamp circuit 105 enables separation or isolation of data line DL from sense line SN, causing sense line SN to decrease in capacitance.

Reportedly, the voltage swing width of data line DL when reading data bits of a logic "0" and logic "1" and that of sense line SN in 0-read and 1-read events exhibit a relationship shown in FIG. 33. In this graph a voltage swing width on sense line SN between 0- and 1-read is represented by $\Delta$VSN whereas that of data line DL is given as $\Delta$VDL. Customarily these widths $\Delta$VSN, $\Delta$VDL are specifically set so that the former is approximately four times greater in value than the latter.

While provision of the clamp circuit results in a decrease in capacitance of the sense line SN, a capacitive balance between sense line SN and reference sense line RSN also affects the resulting sensing speed or rate. More specifically as has been explained in conjunction with FIG. 33, the voltage swing width of sense line SN is about four times greater than that of data line DL. In addition, sense line SN is about ten times less in capacitance than data line DL, wherein approximately 30 percent (%) or more or less of the amount of electrical charge to be charged when looking at from the load 102 is reserved for charge-up of the capacitor of sense line SN. Due to this, unless sense line SN and reference sense line RSN are precisely equalized in capacitance to each other, a difference in chargeup rate between them can result in a delay of data sense operations. In other words, in order to perform the data sense at high speeds, it is important to establish a well-valanced capacitance relation between sense line SN and reference sense line RSN while at the same time establishing a capacitive valance between data line DL and reference data line RDL.

Another purpose of the clamp circuit 105 is to suppress a drain voltage being given via the data line DL to a bit line BL of a cell array during reading. During data reading, in order to detect or sense whether a current is present or absent, a read voltage of the positive polarity is given to the control gate of a memory cell from a word line WL while letting a positive drain voltage be given from bitline BL. This voltage relationship is the same as that during writing of data "0." If the drain voltage is high in potential then little write-in phenomenon (soft write) occurs. To prevent this, it is required that the drain voltage is potentially lowered to an extent that the memory cell MC performs no pentode operations. It is the clamp circuit 105 that performs this task.

On the other hand, in order to achieve high-speed chargeup of the sense line SN, it is an effective way to enlarge the transistor size (channel width) of the current-source load 102. Unfortunately this approach has a limit. This point will be discussed in detail below. See FIG. 34. This graph demonstrates the dependence of the chargeup time and sense line capacitance $C_{SN}$ on the transistor size of current-source load 102. While the size of a load transistor stays less, the load transistor capacitance is less dominant than both the wiring capacitance of sense line SN and the capacitance of remaining circuitry being connected to sense line SN, with the sense line capacitance $C_{SN}$ lessened in gradient. On the contrary, when the load transistor gets larger in size, the load transistor gate capacitance and junction capacitance become relatively larger, resulting in an increase in increment curve of sense line capacitance $C_{SN}$. The time for sense-line charge is variable in a way which follows: while the load transistor stays less in size, it rapidly decreases with an increase in size; when the size becomes larger to a certain extent, a time taken to charge up itself becomes dominant in the sense delay, resulting in a decrease in gradient. As apparent from the foregoing, the scheme for enlarging the load transistor size in order to accelerate sense-line chargeup must come with a limit.

In recent years, most flash memories are designed to have a built-in page mode and/or burst mode as in traditional dynamic random access memory (DRAM) chips. Letting flash memories offer operabilities in these modes calls for the use of an increased number of on-chip sense amplifiers corresponding to one page of data—for example, the page consists of eight (8) words of data, equal to 128 data bits in total. However, with the current-sensing type sense amplifiers stated supra, a need is felt to additionally use a reference data line with more than one dummy data line capacitor large in capacitance value and in area. Obviously, placing multiple sense amplifiers on a chip would result in a likewise increase in chip area due to the presence of such dummy data line capacitors.

As shown in FIG. 32, an equalize circuit 106 is provided between the sense line SN and reference sense line RSN, which is rendered operative prior to execution of a data sense operation to electrically short between these lines SN and RSN and thus short between the data line DL and reference data line RDL to thereby set them at the same potential level. Here, the equalize circuit 106 is formed of an n-channel metal insulator semiconductor filed effect transistor (MISFET).

As shown in FIG. 36 the equalize circuit 106 is driven by an equalize signal EQL to turn on selectively, thereby electrically shorting between the sense line SN and reference sense line RSN. At this time, it should be required for achievement of high-speed sense operations to set a time width t1–t0 of the equalize signal EQL at an optimal value necessary for electrical shorting between sense line SN and reference sense line RSN. When equalize signal EQL potentially drops at Low or "L" level causing an equalize operation to be completed. After completion of the equalization, a difference in voltage potential between sense line SN and reference sense line RSN increases in a way conformity with a voltage differential between data line DL and reference data line RDL. When the differential voltage ΔV reaches a prespecified value, a sense output SAout is obtained.

If the time width of equalize signal EQL is too small, then any reliable equalization is no longer executable. This can cause read errors or, alternatively, cause a delay in the sense operation due to a necessity to reverse or invert the voltage differential between the sense line SN and reference sense line RSN in a data dependent way. If the time width of the equalize signal EQL is too large, then the sense operation can also be delayed.

In the prior flash memory discussed above, what is fully considered with respect to the equalize circuit 106 is the behavior of switching noises. As shown in FIG. 36, the MISFET making up the equalize circuit has a capacitance component C1 between its gate and source and also has a capacitance C2 between the gate and drain thereof. Due to the presence of such capacitances C1, C2, upon releasing of equalization, that is, when the equalize signal EQL changes in potential from High ("H") level to "L" level as shown in FIG. 37, significant switching noises N1, N2 would be added or "superimposed" to the reference sense line RSN and sense line SN.

SUMMARY OF THE INVENTION

A semiconductor memory device is arranged to include an array of memory cells each of which stores data depending on whether current pull-in is present or absent or whether it is large or small, a plurality of sense lines to which read data of said memory cell array are transferred, a reference sense line as commonly used for data sensing at said sense lines while being given a reference voltage for data sensing, and a sense amplifier array having a plurality of sense amplifiers for amplifying a differential voltage between said plurality of sense lines and said reference sense line to thereby determine read data.

DETAILED DESCRIPTION OF THE EMBODIMENTS

Several embodiments of this invention will now be explained with reference to the accompanying drawings below.

Figure 1:
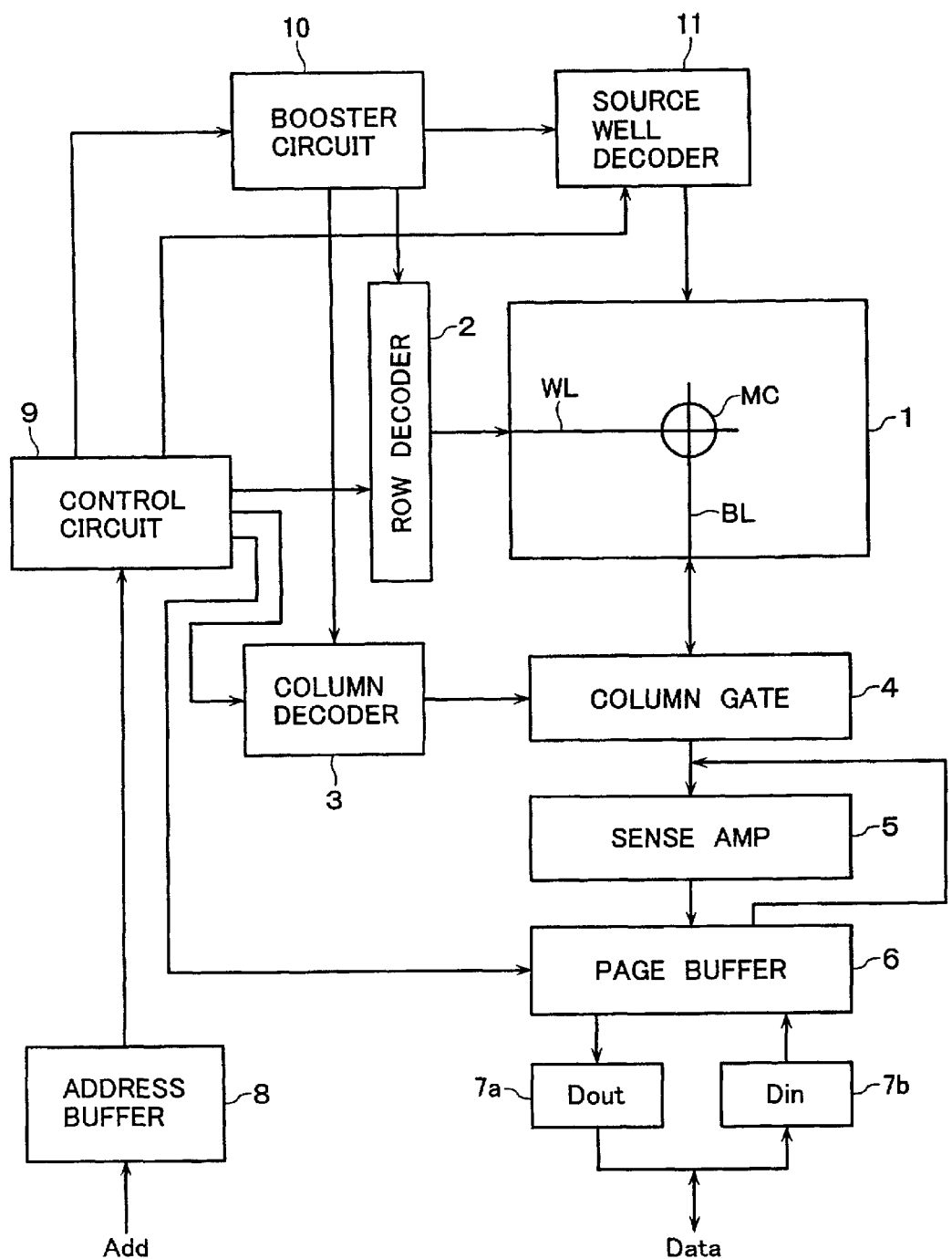
FIG. 1 is a diagram showing equivalent circuit of a flash memory in accordance with an embodiment of this invention.
Figure 2:
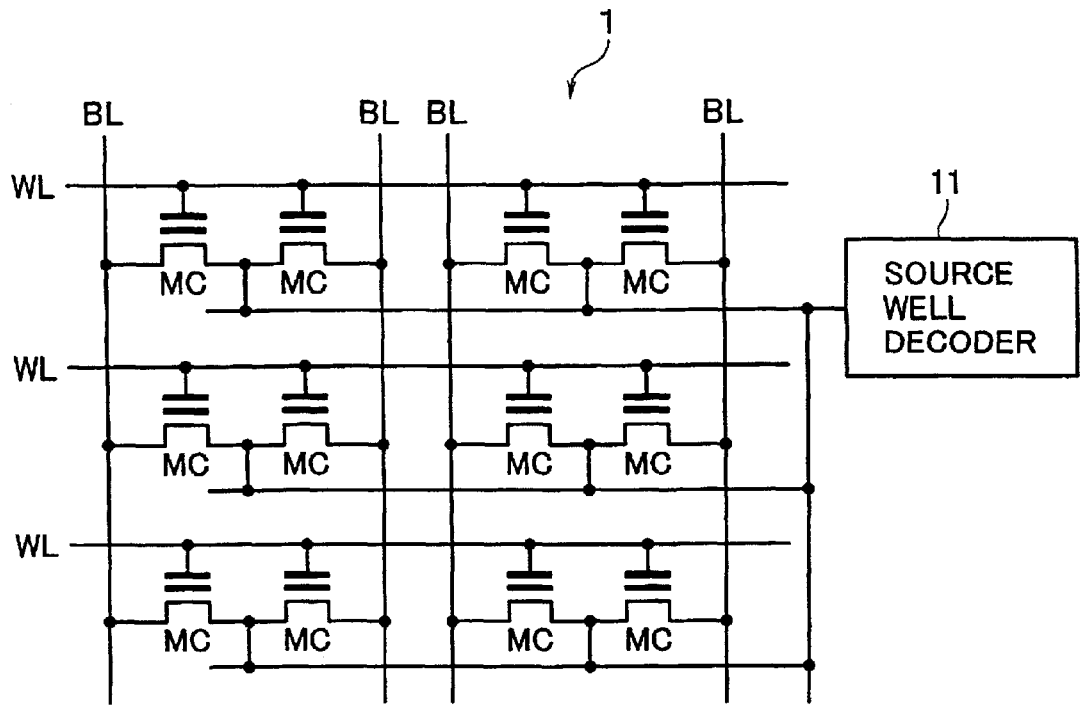
FIG. 2 is a diagram showing an equivalent circuit of a memory cell array of the flash memory of FIG. 1.

Reference is initially made to FIG. 1 for illustrating in block form a configuration of a flash memory device in accordance with an embodiment of this invention. A memory cell array 1 is arranged so that a plurality of parallel word lines WL and a plurality of parallel bit lines BL are crossed over each other to define cross-points or "intersections," at which memory cells MC are disposed and organized into a matrix form of rows and columns. Practically in the illustrative embodiment, as shown in FIG. 2, the memory cell array 1 is constituted by memory cells MC of the stacked-gate metal insulator semiconductor field effect transistor (MISFET) structure, which cells are connected to have the so-called NOR type configuration.

A row decoder 2 is provided for word-line selection. Also provided are a column decoder 3 for bit-line selection and a column gate 4 which is selectively activated by the column decoder 3. An address is sent through an address buffer 8 to a control circuit 9 while an internal row address signal and an internal column address signal are transferred to the row decoder 2 and column decoder 3, respectively.

Data write and erase operations are done by use of voltages of specific potential levels that are potentially raised or elevated from a power supply voltage in a way as will be described later in the description. To do this, a potential elevation or "booster" circuit 10 is provided which is controlled by the control circuit 9 in a way responsive to operation modes. Booster circuit 10 derives an output voltage, which is supplied to wordlines WL through row decoder 2 and also to bitlines BL via column decoder 3. Note that memory cell array 1 is subdivided into blocks, each of which is a unit memory space with all-at-a-time erasable memory cells. Each block has its semiconductor well region. A well decoder 11 is provided for control of the potential level at each well region—say, well potential.

The flash memory of this embodiment is the one that is operable in a page mode. In this respect, a sense amplifier circuit 5 has sense amplifiers that are connected to groups or "bundles" of data lines DL respectively, each of which makes up one page (for example, 128 bits of data). Data as read by the sense amp circuit 5 is held at a page buffer 6. A page of data is randomly accessed under control from the control circuit 9 and is then output through a data output buffer 7a. Write data is sent via a data input buffer 7b to page buffer 6 and temporarily retained therein and then transferred to a data line DL under the control of control circuit 9.

Figure 3:
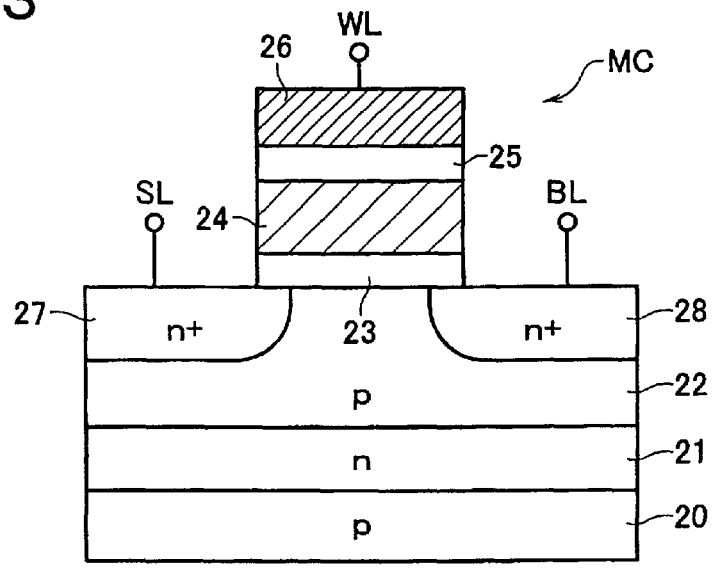
FIG. 3 is a diagram illustrating in cross-section a structure of a memory cell of the flash memory.

Turning to FIG. 3, there is depicted the cross-sectional structure of a memory cell MC. The memory cell MC as shown herein is a nonvolatile memory cell of the MISFET structure having a floating gate 24 for use as an electrical charge accumulation/storage layer and a control gate 26 multilayered over the floating gate 24. More precisely, a p-type silicon substrate 20 has at its top surface, in which a semiconductor well region 21 of n-type conductivity is formed. A p-type well 22 is in turn formed in the n-type well 21, with memory cell MC formed in this p-type well 22.

The memory cell MC is such that its floating gate 24 may be a polycrystalline silicon or "polysilicon" film overlying the p-type well 22 with a gate dielectric film 23 interposed between them. The control gate 26 of cell MC is a polysilicon film overlying floating gate 24 with a dielectric film 25 sandwiched therebetween. Source and drain diffusion layers 27, 28 are formed so that these are self-aligned with control gate 26. Control gate 26 is continuously formed in one direction of the memory cell matrix to function as a wordline WL. Drain diffusion layer 28 is connected to its associated bitline BL whereas source diffusion layer 27 is coupled to a source line SL.

The substrate 20 comes with several p-type wells each similar to the p-type well 22 of FIG. 3, which are formed independently of one another in the n-type well 21 of substrate 20 in units of memory cell blocks, i.e. all-at-once data erase regions. Part of a cell array within one of such blocks is illustrated in FIG. 2, wherein wordlines WL and bitlines BL extend so that these intersect each other with sources of all the memory cells within this block being commonly connected together to a source line SL. Accordingly the independent bitlines BL on a per-block basis are for use as "local" bitlines, which are to be selectively connected to upper-level main bitlines as will be discussed later in the description.

An operation of the memory cell MC is as follows. Data write is carried out in a way such that both the p-type well 22 and the source line SL are potentially set at zero volts while applying a write voltage of approximately 10 volts (V) to a presently selected wordline WL with a 6-V voltage or 0V voltage given to its associative bitlines BL in accordance with the logical value of a data bit being written—i.e. a logic "0" or "1." At a memory cell that is given logic "0" data, a strong lateral-directional electric field is created between its drain and source resulting in production of "hot" electrons, which are then injected to and stored on the floating gate 24. In the case of logic "1" data, such electron injection hardly occurs.

The electron injection to the floating gate 24 results in a likewise increase in threshold voltage—this state is storage of logic "0" data. In the case of "1" data, no hot electrons are produced resulting in no electrons stored on the floating gate 24. This is an erase state, which retains logic "1" data storage low in threshold voltage.

Data erase is done so that all the cells are erased at a time on a per-block basis. At this time a voltage of about 10V is applied to the n-type well 21 and also to the p-type well 22 of a presently selected block plus the source line SL while applying a voltage of about −7V to all the wordlines WL within the selected block. With the voltage application scheme, a significant electric field is applied to the gate dielectric film 23 of every memory cell within the block causing electrons stored on its floating gate to release or discharge by a flow of Fowler-Nordheim (FN) tunneling current, resulting in establishment of the erase state of data "1."

Data read is done by giving to a selected wordline a read voltage that is set at an intermediate potential level midway between the threshold values of data "0" and "1" and then letting a sense amplifier being coupled to the bitline of interest determine whether memory cell current pull-in is present or absent.

Figure 4:
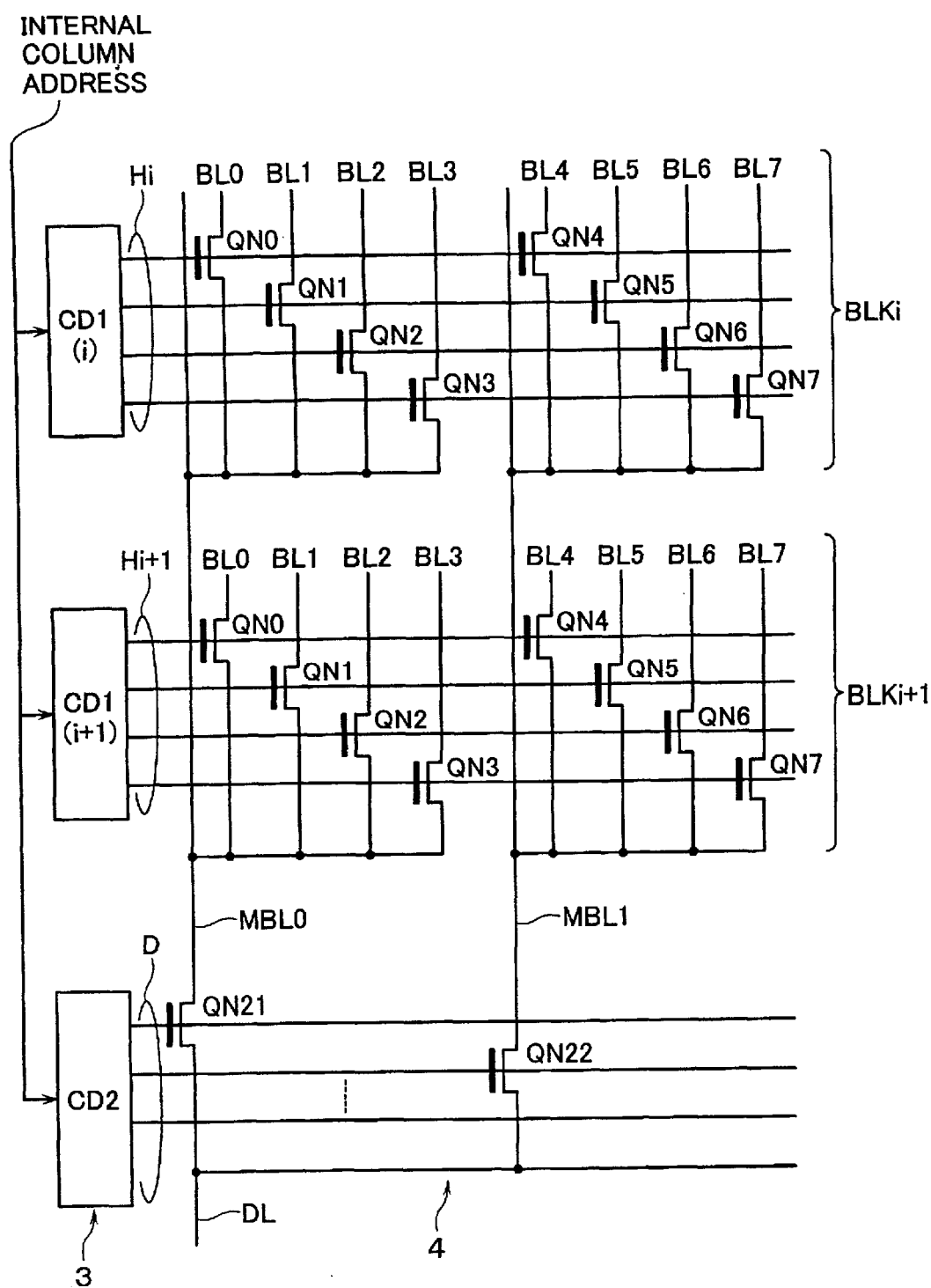
FIG. 4 is a diagram depicting equivalent circuits of column decoders and column gates of the flash memory.

See FIG. 4. This diagram depicts a configuration of the column decoder 3 and that of column gate 4. As stated previously, local bitlines BL per each block BLKi, BLKi+1, . . . of the memory cell array 1 are arranged so that these are organized into groups or "bundles" of a prespecified number, e.g. four, of bitlines. Respective four bitlines in each bundle are selectively connected to a corresponding one of the main bitlines MBL0, MBL1, . . . through column gate transistors QN0 to QN3, QN4–QN7, . . . , each for one local bitline. The column decoder 3 has a first column decode circuit CD1 operable to perform bitline selection of each block and a second column decode circuit CD2 for performing main bitline selection.

The column gate transistors QN0–QN3 and QN4–7 shown in FIG. 4 have their gates which are potentially controlled by first column select lines Hi, Hi+1, . . . that are output lines of the first column decode circuit CD1. Similarly the gates of column gate transistors QN21, QN22, . . . are potentially controlled by output lines of the second column decode circuit CD2 for use as second column select lines D.

A presently selected bitline BL of a selected block is connected to its associative main bitline MBL through a column gate transistor being presently activated by one of the first column select lines Hi, Hi+1, . . . ; further, the main bitline MBL is to be coupled to a data line DL via a column gate transistor as made active by one of the second column select lines D.

Figure 5:
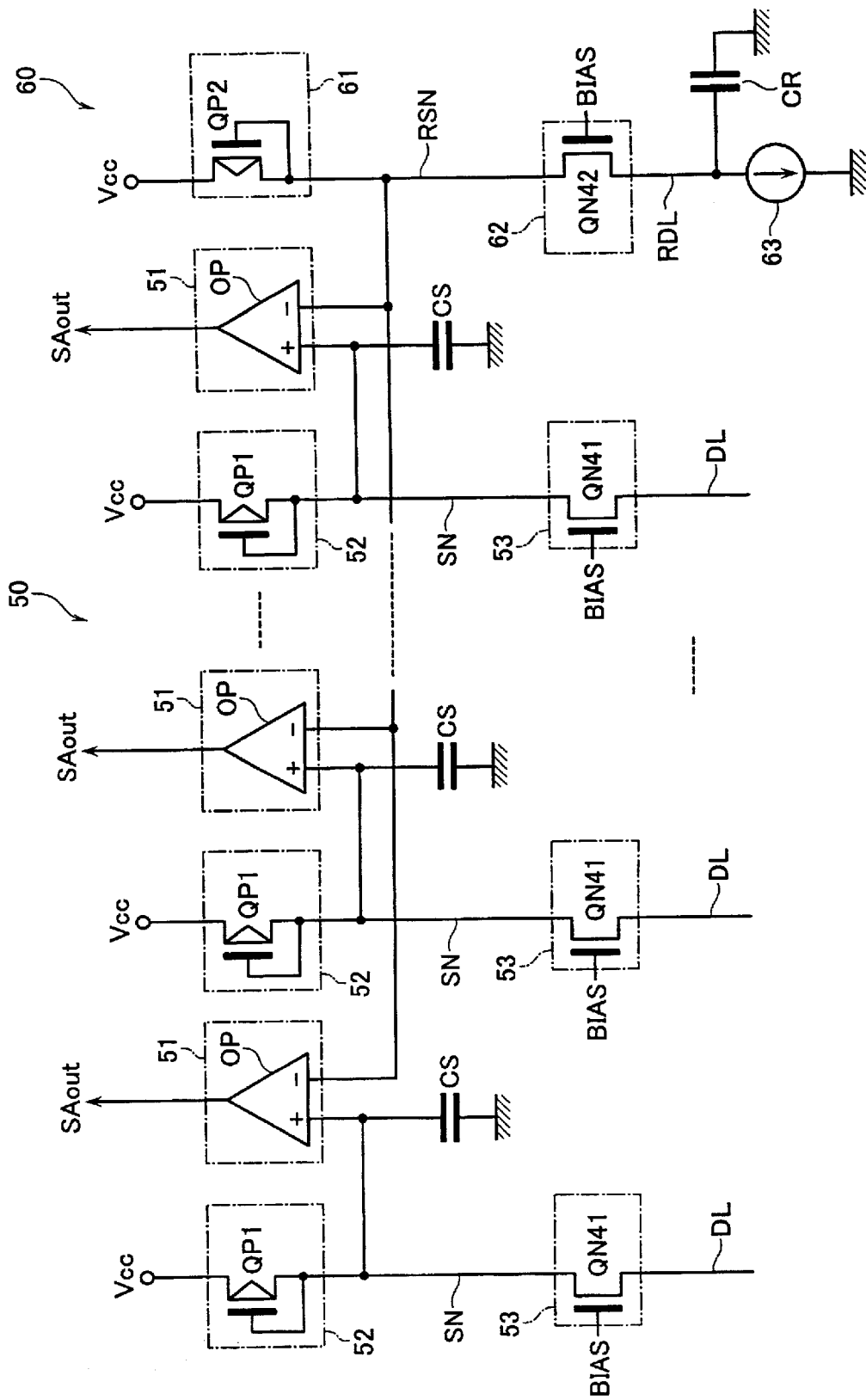
FIG. 5 is equivalent circuitry showing a configuration example of main part of a sense amplifier circuit of the flash memory.

See FIG. 5, which shows a configuration of main part of a sense amplifier circuit 5 as connected to the data line DL.

In this embodiment, in order to perform the intended page mode operation, the sense amp circuit 5 has an ensemble of sense amplifiers as laid out therein. These sense amps correspond in number to one page—here, the page consists of eight words of data, equivalent in total to 128 bits of data, by way of example. Very importantly, the great number of such sense amps are arranged in such a manner that several ones of them use in common a reference voltage generation circuit. This is a principal feature unique to the invention as disclosed and claimed herein. In FIG. 5, there is shown a configuration of circuitry including one sense amplifier array 50 and a reference voltage generator circuit 60 commonly used or "shared" by each sense amp within this sense amp array 50, which is sometimes called the sense amp "chain" or "train."

Respective sense amplifier main bodies or "cores" of the sense amp array 50 are differential amplifiers 51 in the circuitry of FIG. 5. The differential amplifiers 51 each have two input terminals: an inverting input and a non-inverting input. The non-inverting inputs are connected to the independent sense lines SN, respectively. The inverting inputs are common-coupled together to a reference sense line RSN. Each sense line SN is connected to a supply voltage Vcc through a current-source load 52. This load consists essentially of a MISFET, which is illustratively formed of a p-channel metal oxide semiconductor (PMOS) transistor QP1 with its gate and drain coupled together. Similarly the reference sense line RSN is connected to the supply voltage Vcc via a current-source load 61 formed of a gate/drain-coupled PMOS transistor QP2.

Each sense line SN is connected to a data line DL through a clamp circuit (separation circuit) 53. The clamp circuit 53 is illustratively formed of a MISFET of the opposite channel type—here, n-channel MOS (NMOS) transistor QN41 having its gate with a predefined bias voltage BIAS applied thereto. The reference sense line RSN is connected to a reference data line RDL via a clamp circuit 62 which is configured from an NMOS transistor QN42 having its gate with a bias BIAS given thereto. As in the prior art, these clamp circuits 53, 62 are provided for allowing the sense lines SN and the reference sense line RSN to significantly swing in potential while at the same time suppressing voltage swing widths of data lines DL and reference data line RDL.

Connected to the reference data line RDL is a current source 63 which is operable to permit flow of a current that is midway between the current values of logic "0" and "1" data bits of memory cells MC being connected to data line DL. In view of the fact that data line DL is connected to bitline BL through multiple stages of column gate transistors as stated supra, data line DL has a relatively larger capacitance value. Thus, a dummy data line capacitance component CR is coupled to reference data line RDL to thereby provide the load capacitance that is substantially the same in value as the above-noted capacitance of data line DL.

The reference sense line RSN and the current-source load 61 connected thereto plus part of the reference data line RDL with reference sense line RSN connected thereto via clamp circuit 62 make up the reference voltage generator circuit 60 that is commonly used or shared by the sense amps 51 of the sense amp array 50. With such configuration of reference voltage generator circuit 60, a reference voltage for data sense at each sense line SN is given to reference sense line RSN.

Figure 6:
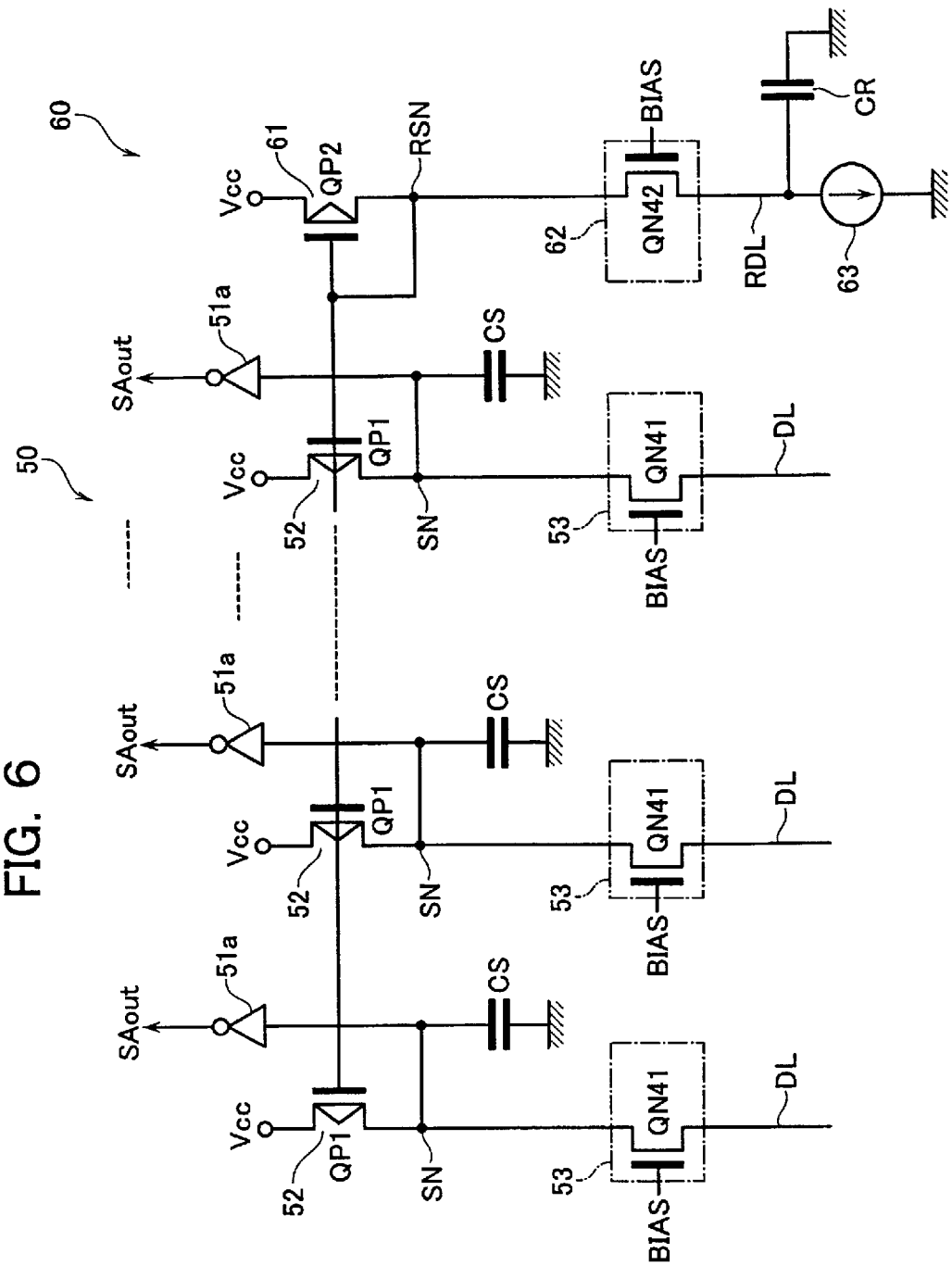
FIG. 6 is an equivalent circuit showing another configuration example of main part of the sense amplifier circuit.

Turning to FIG. 6, there is shown another configuration example of the sense amp array 50 and reference voltage generator circuit 60. In this example the sense amp core is formed of an inverter 51a rather than the differential amplifier 51 of FIG. 5. Alternative use of such inverter in pace of the differential amplifier results in that the current-source load 61 being connected to the reference sense line RSN and the current-source load 52 as connected to each sense line SN make up a current mirror circuit. More specifically the current-source load 61 has a PMOS transistor QP2 with its gate and drain common-connected to reference sense line RSN whereas each sense amp has a PMOS transistor QP1 for use as its current-source load 52 with its gate coupled to reference sense line RSN.

Figure 7A:
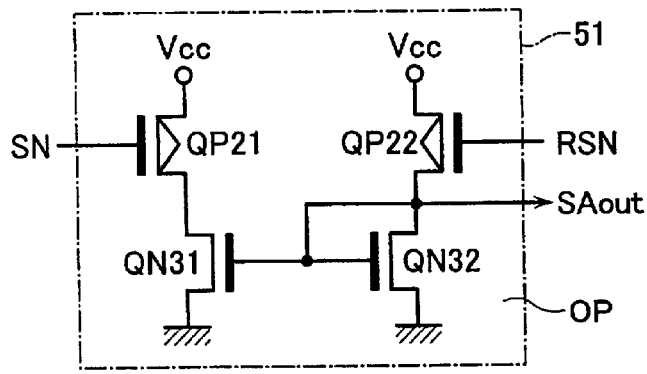
FIGS. 7A to 7C are diagrams each showing an exemplary configuration of a differential amplifier of FIG. 5.
Figure 7B:
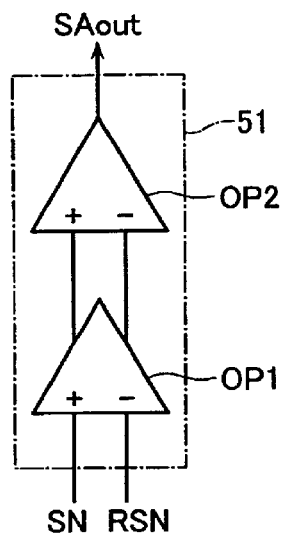
Figure 7C:
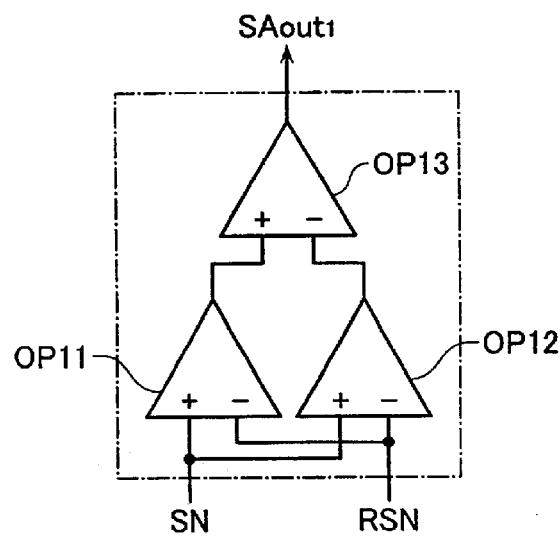

The differential amplifier 51 of FIG. 5 may be modified to have any one of circuit configurations shown in FIGS. 7A–7C. FIG. 7A shows exemplary circuitry configured from a single operational amplifier OP, which includes a differential pair of PMOS transistors QP21–QP22 and a current mirror load formed of NMOS transistors QN31–QN32. FIG. 7B depicts an exemplary circuit that employs two stages of op-amps OP1–OP2. FIG. 7C shows an example using at its input stage a parallel combination of op-amps OP11–OP12 along with an opamp OP13 for providing a difference between output voltages of opamps OP11–12.

Figure 8A:
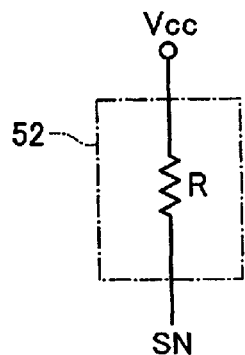
FIGS. 8A and 8B are diagrams each showing a configuration example of a current-source load of FIG. 5.
Figure 8B:
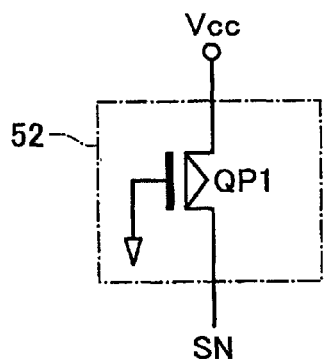

The load 52 of FIG. 6 may be a resistor R as shown in FIG. 8A or alternatively a gate-grounded PMOS transistor QP1 as shown in FIG. 8B.

Figure 9A:
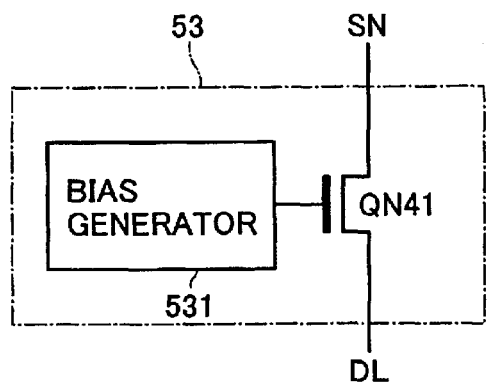
FIGS. 9A–9B are diagrams each showing a configuration example of a clamp circuit of FIG. 5.
Figure 9B:
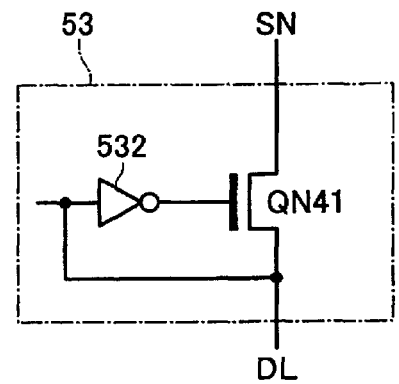

In regard to the clamp circuit 53, this circuit may be arranged so that a bias voltage generator circuit 531 is provided for driving the gate of NMOS transistor QN41 as shown in FIG. 9A; alternatively it may be designed as a feedback type one, wherein an inverter 532 is used for feedback of a potential on data line DL to thereby control the gate of NMOS transistor QN41 as shown in FIG. 9B. In this case the clamp circuit's bias voltage generator circuit 531 is preferably usable in common by sense line SN and reference sense line RSN. With such sharing scheme, it becomes possible upon start-up of a sense operation to cause any possible noises being mixed into the bias voltage BIAS to stay virtually the same with respect to the main body side and the reference side.

Figure 11:
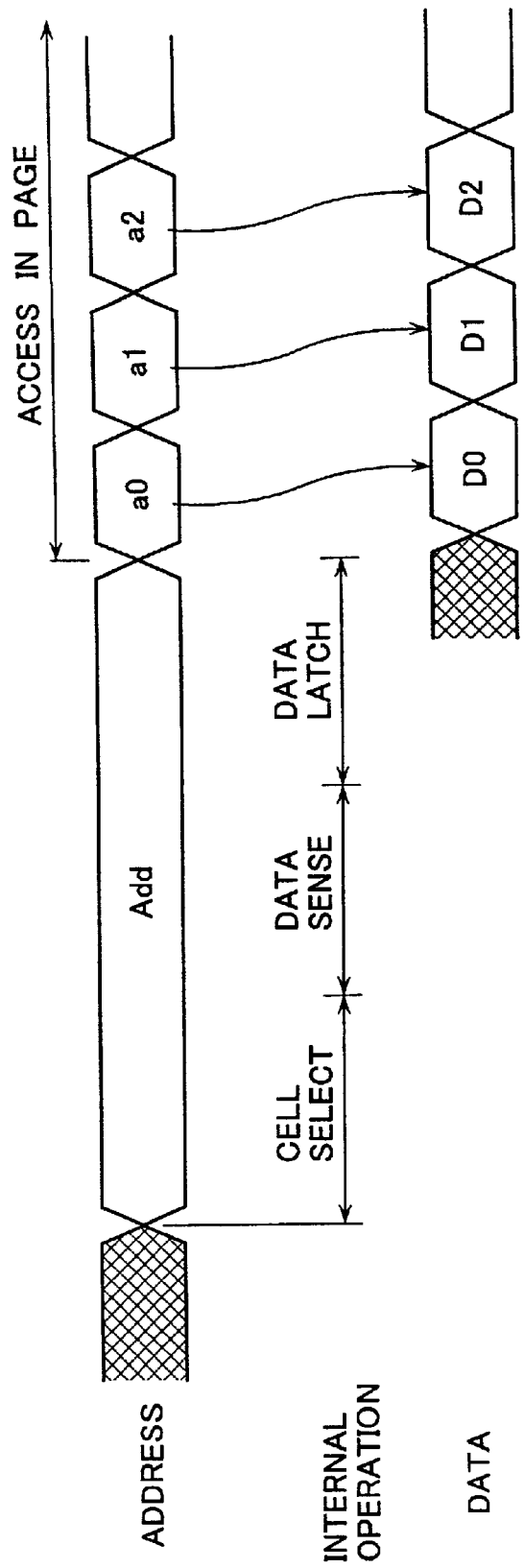
FIG. 11 is a timing diagram for explanation of a read operation in page mode of the same embodiment.

Referring next to FIG. 11, a read operation timing is shown in the page mode of the flash memory chip in accordance with this embodiment. Upon input of a page address Add for memory cell selection, data of a selected memory cell is sensed causing a sense result to be latched in a page buffer. A certain length of time—e.g. 100 nanoseconds (ns)—must be taken to perform the internal operation up to completion of the sense result latching, which time is relatively longer due to the utilization of electrical charging and discharging of a data line of large load capacitance values being associated with both a main bitline and local bitline connected thereto. After having latched a single page of data bits in the page buffer, the within-the-page address is switched at high speeds in a specified order of sequence of a0, a1, a2, . . . , thereby to output corresponding data D0, D1, D2, . . . Such access within this page may be done within a shortened length of time period as less as 25 ns for example, since it rarely experiences charge-up/discharging of large load capacitances.

Unlike the prior art with reference voltage generator circuits provided in units of sense amplifiers, the embodiment as discussed herein is such that a single reference voltage generator circuit 60 is commonly used or "shared", by the sense amp array 50 containing multiple sense amplifiers. With this "reference voltage generator sharing" feature, it is possible to advantageously reduce the requisite number of dummy data line capacitors CR each requiring consumption of an increased on-chip area, which in turn makes it possible to minimize resultant capacitor areas, thus enabling shrinkage of the chip area of the flash memory.

Regrettably, the above advantage does not come without accompanying a penalty which follows. The common use or sharing of the reference voltage generator circuit 60 by the sense amp array 50 can often cause significant destruction of a capacitive balance between the sense line SN and the reference sense line RSN because of the fact that an increased number of sense amps are connected together to reference sense line RSN. As has been discussed in the introductory part of the description, in order to perform data sense at high speeds, it is also important to stably maintain the data line DL and reference data line RDL in a capacitively well balanced state while simultaneously letting the sense line SN and reference sense line RSN be kept capacitively well balanced.

In view of this point, as shown in FIG. 5, each sense line SN is designed so that a dummy sense line capacitor CS is added thereto. In this way, the sense line SN is intentionally increased in capacitance in conformity with an increase in capacitance of the reference sense line RSN occurring due to connection of multiple sense amps to reference sense line RSN, thereby causing the sense line SN and reference sense line RSN to become substantially the same as each other in capacitance value. The same goes with the sense amp circuit configuration of FIG. 6.

Figure 10:
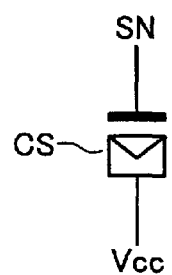
FIG. 10 is a diagram showing a configuration example of a dummy sense line capacitor of FIG. 5.

The dummy sense line capacitor CS in FIG. 5 is attainable by mere addition of more than one extra transistor. For instance, as shown in FIG. 10, a specified number of PMOS transistors each of which is the same in gate area as the input-stage PMOS transistor of differential amplifier 51 that is a core component of sense amplifier, wherein the number is given as the number of sense amps minus one—i.e. r–1, where r is the sense amp number. Similarly in the case of the FIG. 6 circuitry also, the above-identified number, r–1, of PMOS transistors identical in gate area to the current-source load 52's PMOS transistor are provided together therein.

In this way, adding the dummy sense line capacitors to the sense lines SN to thereby establish a capacitive balance relative to the reference sense line RSN makes it possible to attain high-speed accessibilities in case the sense amp array 50 shares the reference voltage generator circuit 60.

With the embodiments stated above, many sense amps for a single page is equally divided into a specified number of, e.g. eight, sense amp arrays or "trains" with a single reference voltage generator circuit provided for each of them. Unfortunately, actually implemented flash memories are incapable of incorporating such "sense-amp equal division" technique in some cases. A typical example is that flash memories employ redundancy circuit schemes which call for additional spare column data lines (spare data lines) with sense amps provided in units of respective spare data lines.

Figure 12:
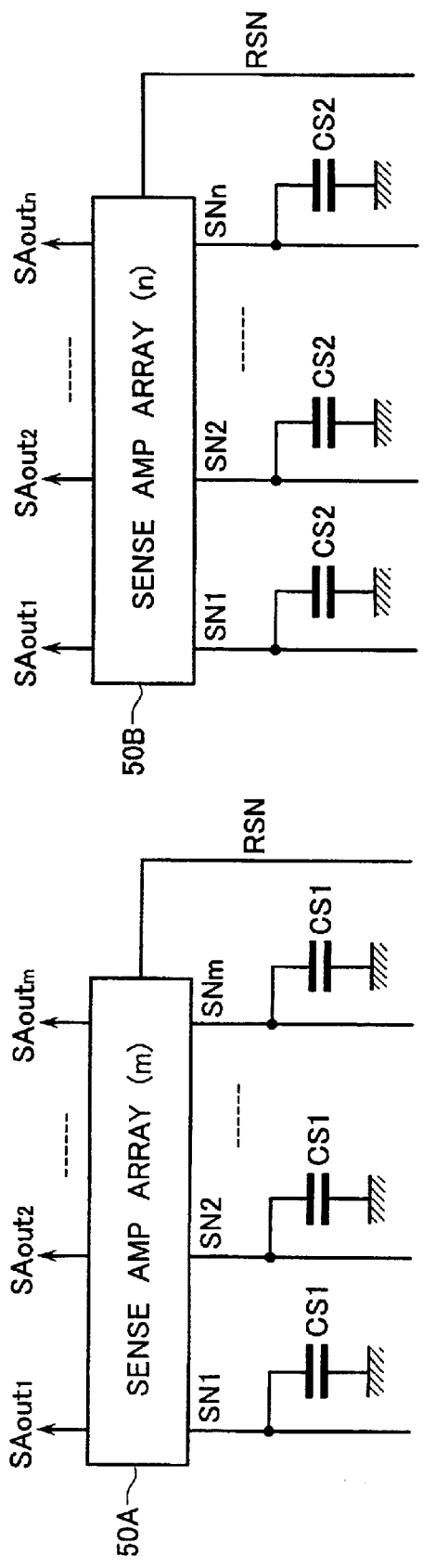
FIG. 12 is a diagram showing another configuration example of sense amplifier circuitry.

If this is the case, let sense amplifier arrays of different sense amp numbers coexist on a flash memory chip. More precisely as shown in FIG. 12, a first sense amp array 50A and a second sense amp array 50B are provided. The first sense amp array 50A includes m sense amplifiers whereas the second array 50B includes n sense amps, where m is an integer more than or equal to two (2), and n is less than m (n<m). On the sense amp array 50A side, dummy sense capacitors CS1 corresponding to (m–1) PMOS transistors are connected to sense lines SN1-SNm respectively; on the sense amp array 50B side, dummy sense capacitors CS2 equivalent to (n–1) PMOS transistors are coupled to respective sense lines SN1–SNn.

A practical example is that the first sense amp array 50A is connected to every set of eight (m=8) normal data lines DL whereas the second sense amp array 50B is to each set of two (n=2) or three (n=3) spare data lines.

With such an arrangement, it is possible to permit the reference sense line RSN and sense lines SN to be capacitively well balanced in each sense amp array 50A, 50B.

It must be noted here that in the configuration of FIG. 12, the dummy sense line capacitor CS1 of the first sense amp array 50A is greater in capacitance value than that CS2 of second sense amp array 50B, namely CS1>CS2, in a way corresponding to the relation of m>n when an attempt is made to put the capacitors in a capacitively well valanced state within a respective one of the sense amp arrays. This would result in unwanted creation of a difference between data-line charge speeds due to respective sense amps, which in turn leads to a difference in sense speeds, although the intended capacitive valance is established within each sense amp array 50A, 50B.

Figure 13:
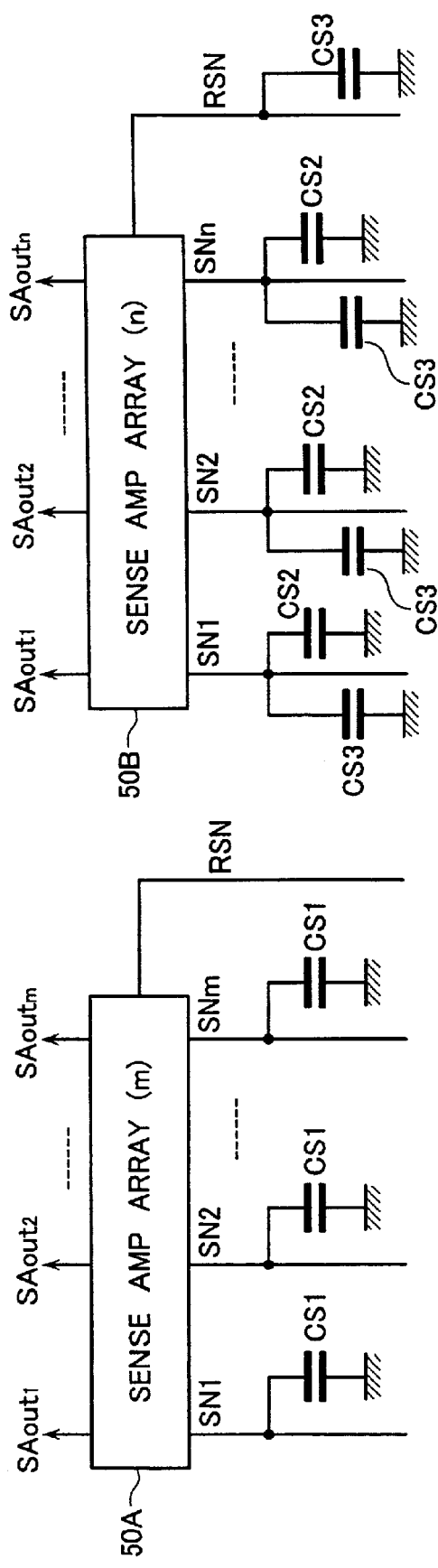
FIG. 13 is a diagram showing still another configuration example of the sense amplifier circuitry.

To preclude such sense speed difference, it is desirable to match in capacitance value the dummy sense-line capacitors being connected to respective sense lines SN of the two sense amp arrays 50A, 50B. An example of this approach is shown in FIG. 13. The circuitry shown herein is similar to that of FIG. 12 with the second sense amp array 50B being modified in a way such that another dummy sense-line capacitor CS3 is additionally coupled to each of the sense lines SN1–SNn and to reference sense line RSN. In this case this array 50B is subject to specific value setting relative to the first sense amp array 50A, causing the dummy sense-line capacitors CS1–CS3 to satisfy a relation of CS1=CS2+CS3.

In this way, even when the second sense amp array 50B slightly loses its capacitive balance therein, it is possible to achieve high-speed sense operations by aligning or equalizing the sense line capacitance values of the first sense amp array 50A and second sense amp array 50B to thereby allow these arrays 50A, 50B to offer the same data-line charge speed or rate.

In the circuit configuration of FIG. 5, the PMOS transistors of current-source loads 52, 61 can experience a deviation in gate areas thereof, resulting in the threshold values being varied or fluctuated accordingly. This causes bad influence upon the resulting sense speed. Typically the threshold voltage variation or deviation is in inverse proportion to a square root of transistor gate area. This may be given as $D = k \cdot A^{1/2}$, where D is the threshold deviation, k is a constant, A is the gate area. Reportedly, if such a threshold voltage variation is present then the sense speed decreases accordingly, since any intended data determination is made impossible unless a specific potential difference is available between the sense line SN and reference sense line RSN, which difference is large enough to go beyond a difference of threshold values (absolute values).

Figure 34:
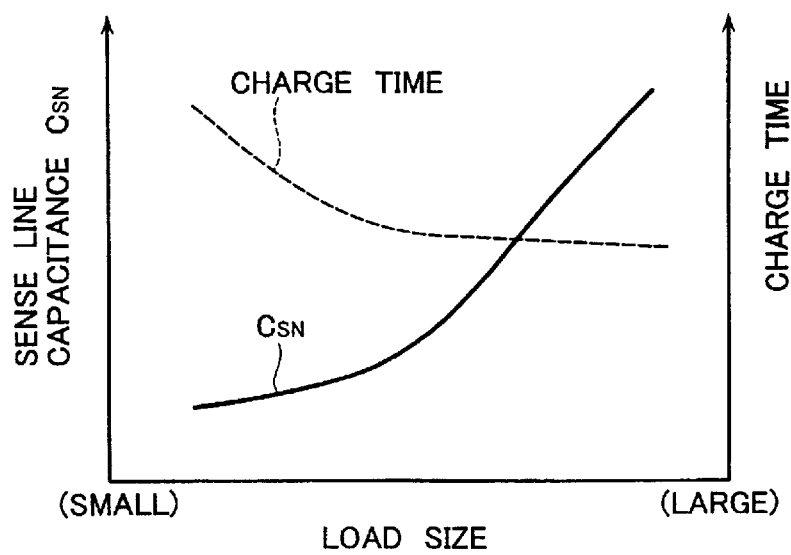
FIG. 34 is a diagram showing a relationship of a load size versus a sense line capacitance and data line charging speed.
Figure 35:
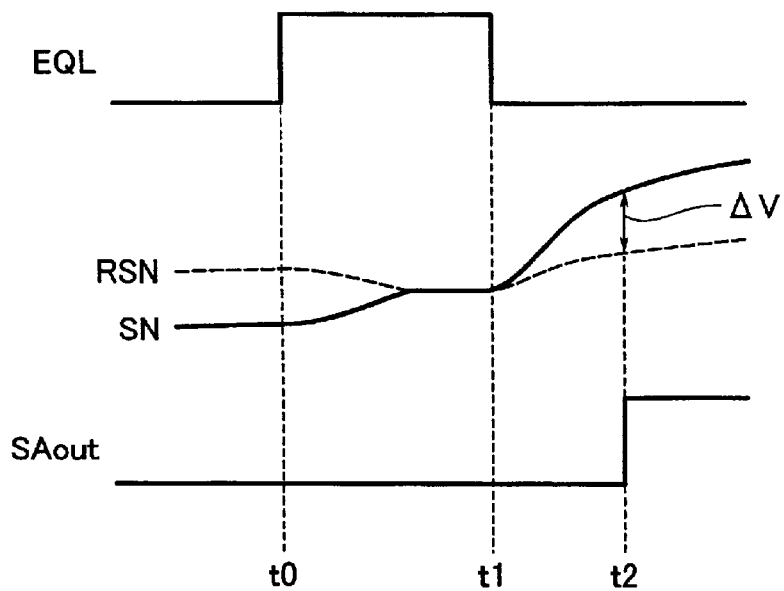
FIG. 35 is a diagram for explanation of an equalize operation executed by an equalize circuit.
Figure 36:
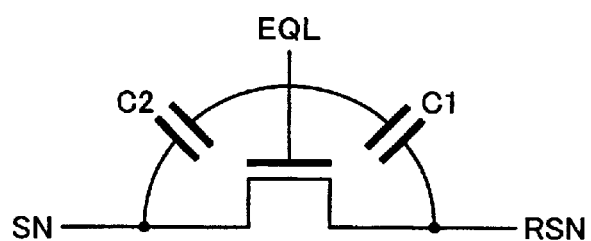
FIG. 36 is a diagram showing a manner of capacitive coupling due to the equalize circuit.

In contrast, with this embodiment, it is effective that the current-source load 52, 61 is designed to have its gate area greater than that of the input-stage PMOS transistor in difference amplifier 51 by way of example to thereby lessen any possible threshold variation. Generally it has been believed that an excessive increase in load size is not so preferable because this can result in a likewise increase in sense-line capacitance as has been discussed in conjunction with FIG. 34. In this embodiment, however, letting the reference sense line RSN be shared by multiple sense lines permits the reference sense line RSN to increase in capacitance to an extent that several times greater than standard ones; in a way corresponding thereto, the dummy sense line capacitors CS are added to sense lines SN causing the sense line capacitance to become greater accordingly. Thus, even where the gate areas of current-source loads 52, 61 are made larger, this seldom affects the sense line capacitance, which in turn encourages technicians to expect that it is possible to advantageously suppress or minimize unwanted variations in threshold voltages of the current-source loads.

Similarly in the case of FIG. 6 also, it is effective to suppress the influenceability of threshold voltage variation by designing the current-source loads 52, 62 so that the gate area of each is greater than that of the inverter 51a.

Figure 14:
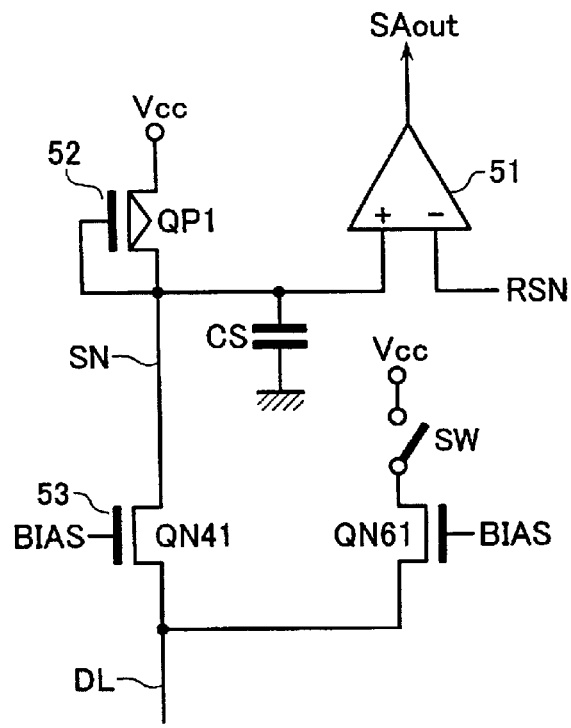
FIG. 14 is a diagram showing a configuration with a sense line charge-up accelerator circuit provided therein.

In this invention, the sense lines and reference sense line become larger in capacitance than the prior art. Obviously this capacitance increase results in a likewise increase in time as taken to charge up data lines during sensing, which in turn leads to an increase in time taken to charge up bitlines. Fortunately this increased time consumption is avoidable by provision of circuitry for acceleration of data line charge-up. An example of such accelerator circuitry is shown in FIG. 14. This circuit includes an NMOS transistor QN61 for charge acceleration use. The charge accelerator transistor QN61 has its one end connected to the data line DL side of a clamp circuit 53. The other end of transistor QN61 is coupled to the supply voltage Vcc through a switch SW, with its gate being applied a bias voltage BIAS which is the same as that of the NMOS transistor QN41 of clamp circuit 53.

In this way, the switch SW is driven to turn on during data sensing while letting the NMOS transistor QN61 function as an auxiliary current source, thus enabling acceleration of a chargeup operation of data line DL. Note however that this data-line chargeup scheme is faced with difficulties in timing control of the switch SW, which leads to a risk that the data line DL can be excessively charged or overcharged if the timing is deviated.

Figure 15:
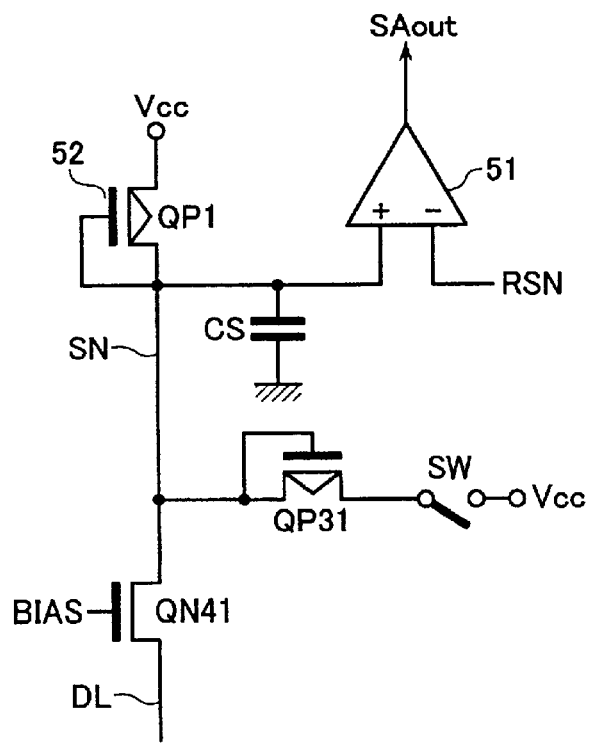
FIG. 15 is a diagram showing another configuration with a sense line chargeup accelerator circuit provided therein.

Consequently in this embodiment, a more preferable approach is to connect a charge-use PMOS transistor QP31 to the sense line SN side of clamp circuit 53 as shown in FIG. 15. Here, the charger transistor QP31 is a diode-coupled PMOS transistor as in the current-source load 52, wherein one end of transistor QP31 is connected via switch SW to supply voltage Vcc.

In this way it is possible to accelerate charge operations of the sense and data lines SN, DL by making the switch SW turn on during data sensing to thereby permit the PMOS transistor QP31 to act as the auxiliary current source. In this case the charging of data line DL is limited by the clamp circuit 53, thus avoiding data line overcharge risks even where little deviation or "offset" is found in timing of the switch SW. Another advantage is that a capacitance increase of sense line SN occurring due to provision of the charging PMOS transistor QP31 stays less in degree of influence because the capacitance is originally increased by addition of the dummy sense line capacitor CS.

Figure 32:
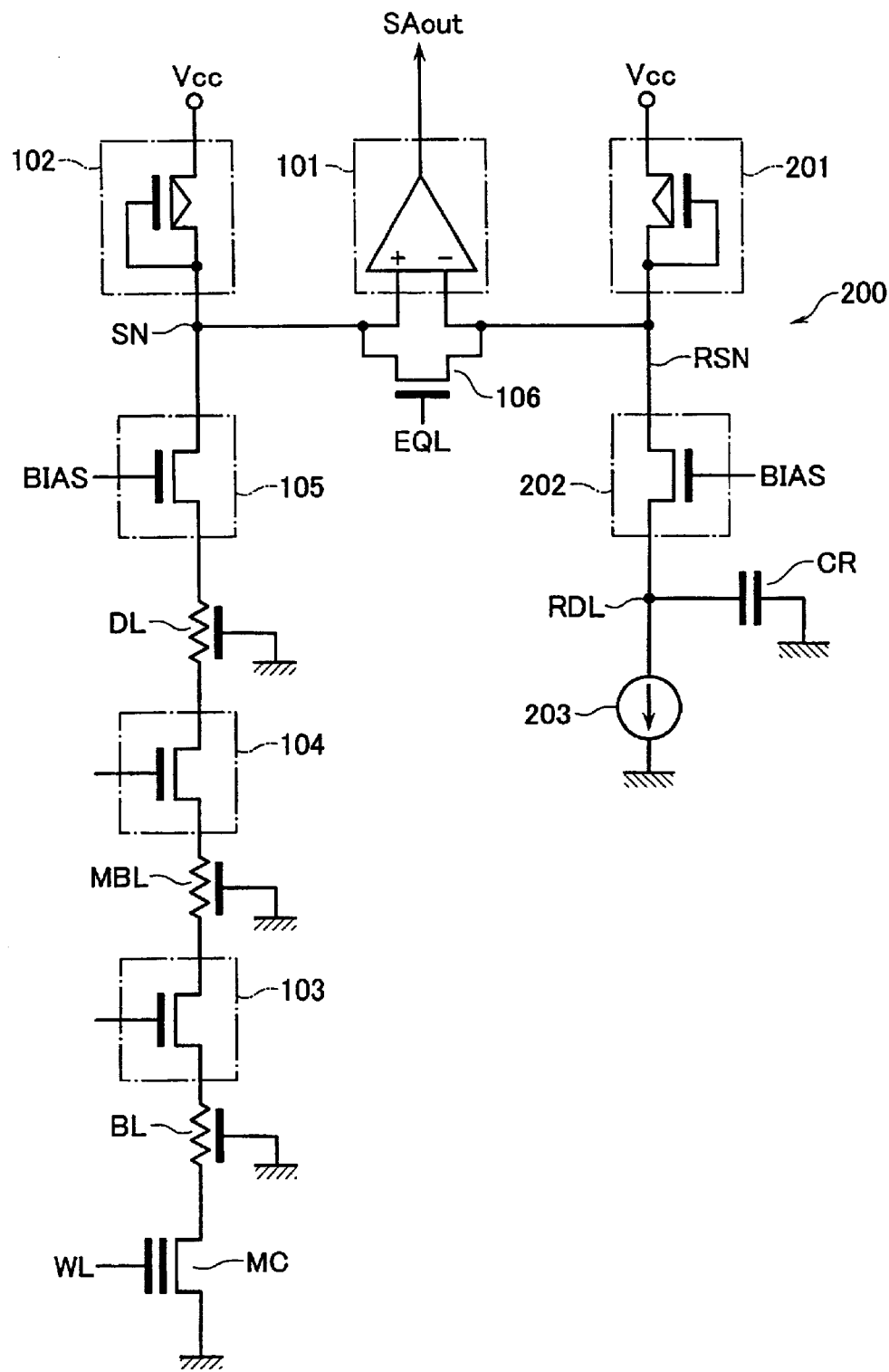
FIG. 32 is a diagram showing a configuration of one prior art sense amplifier circuit.
Figure 33:
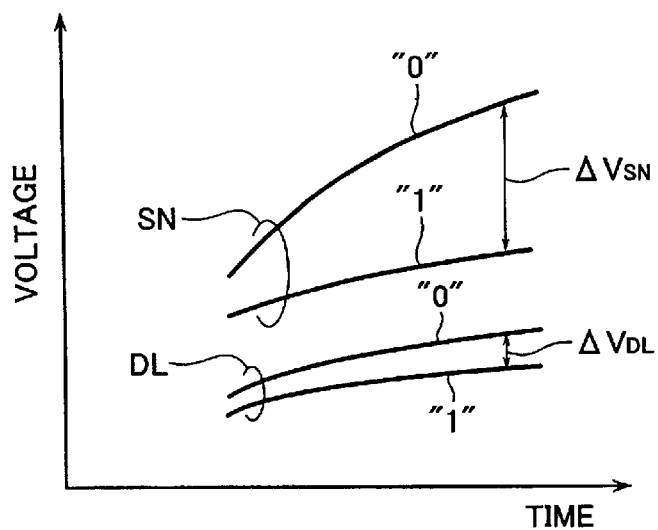
FIG. 33 is a graph showing potential variations with time of a data line and a sense lines during data sensing.

So far, the embodiment and its possible modifications have been set forth employing the scheme for letting multiple sense amplifiers share the reference voltage generator circuit. When actual reduction to practice, this approach requires use of equalize circuitry for initial setup of both the sense lines and the reference sense line at an identical potential level prior to execution of data sensing. See FIG. 37, which demonstrates the behavior of switching noises occurring in the case of the circuit configuration of FIG. 32 with an equalize circuit provided between a sense line SN and its associative reference sense line RSN. Assume that the sense line SN and reference sense line RSN are laid out in the form of a pair at a ratio of "1:1." Suppose that sense line SN and reference sense line RSN are the same in capacitance as each other. In this case, switching noises N1, N2 of FIG. 37 must be equal to each other theoretically. However, a problem occurs in cases where many sense lines SN share a single reference sense line RSN with an equalize circuit provided between each sense line SN and the reference sense line RSN. In this case each sense line SN is operatively associated with a single equalize circuit connected thereto whereas reference sense line RSN is with multiple equalize circuits. The presence of such equalize circuit number difference results in the noise N1 coupling to reference sense line RSN becoming several times greater than the noise N2 coupling to each sense line SN as shown in FIG. 37.

Figure 37:
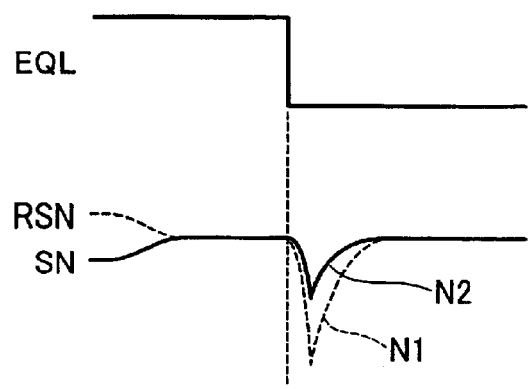
FIG. 37 is a diagram for explanation of switching noises due to the equalize circuit.

Also note that the switching noises N1, N2 shown in FIG. 37 can sometimes become approximately ten times greater (about 200 mV) than a differential voltage between the data line DL and reference data line RDL during data sensing. The result is that whenever the voltage relationship of sense line SN and reference sense line RSN is reversed temporarily, the sense amplifier concerned must be expected to operate in such a way as to again invert or "re-invert" this voltage relation. This would result in loss of high-speed sense performance.

An explanation will next be given of an embodiment which employs equalize circuitry as designed by taking these issues into consideration.

Figure 16:
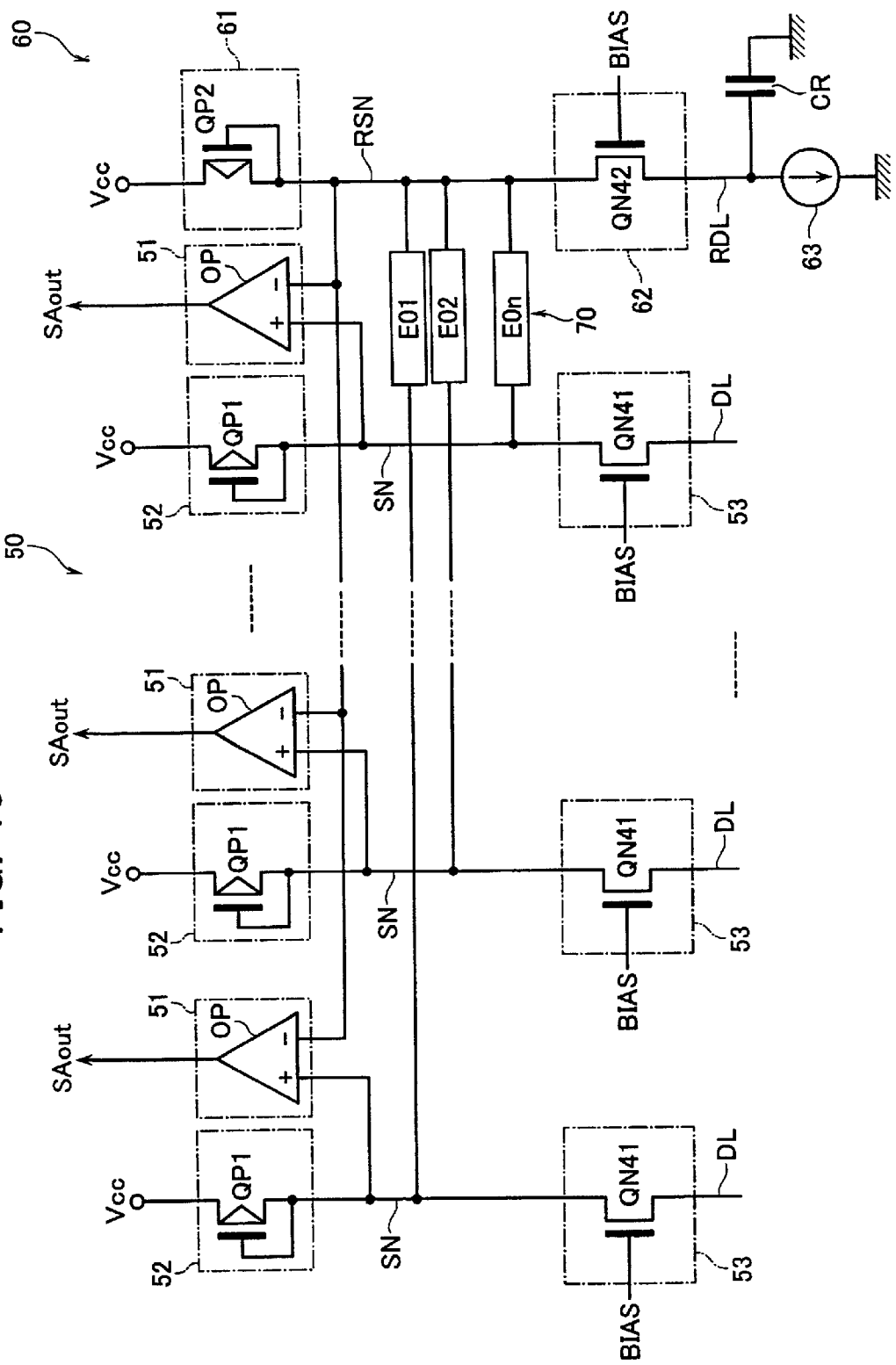
FIG. 16 is a diagram showing a configuration example of sense amplifier circuitry with equalize circuits provided therein.

FIG. 16 shows a configuration of circuitry almost similar in principal design to that of FIG. 5 with an equalize circuit group or "assembly" 70 added thereto. This assembly 70 consists of a plurality of, n, equalize circuits E01, E02, ..., E0n being interposed between respective sense lines SN and a common reference sense line RSN. Equalize circuit assembly 70 is for electrically shorting between each sense line SN and the reference sense line RSN prior to data sensing to thereby set them at an identical potential level. Simultaneously, assembly 70 is operable to initially set a data line DL being connected to each sense line SN and a reference data line RDL coupled to the reference sense line RSN at an identical potential level. A practically implemented configuration of this equalize circuit assembly 70 will be described later in the description.

As previously stated, letting the sense amplifier array 50 share the reference voltage generator circuit 60 results in many sense amplifiers being connected together to the reference sense line RSN, which can often cause destruction of a capacitive balance between the sense line SN and reference sense line RSN. As has been discussed in the introductory part of the description, it is also important in order to perform data sensing at high speeds to establish a good balance in capacitance between the sense line SN and reference sense line RSN in addition to a capacitive balance between data line DL and reference data line RDL.

Figure 17:
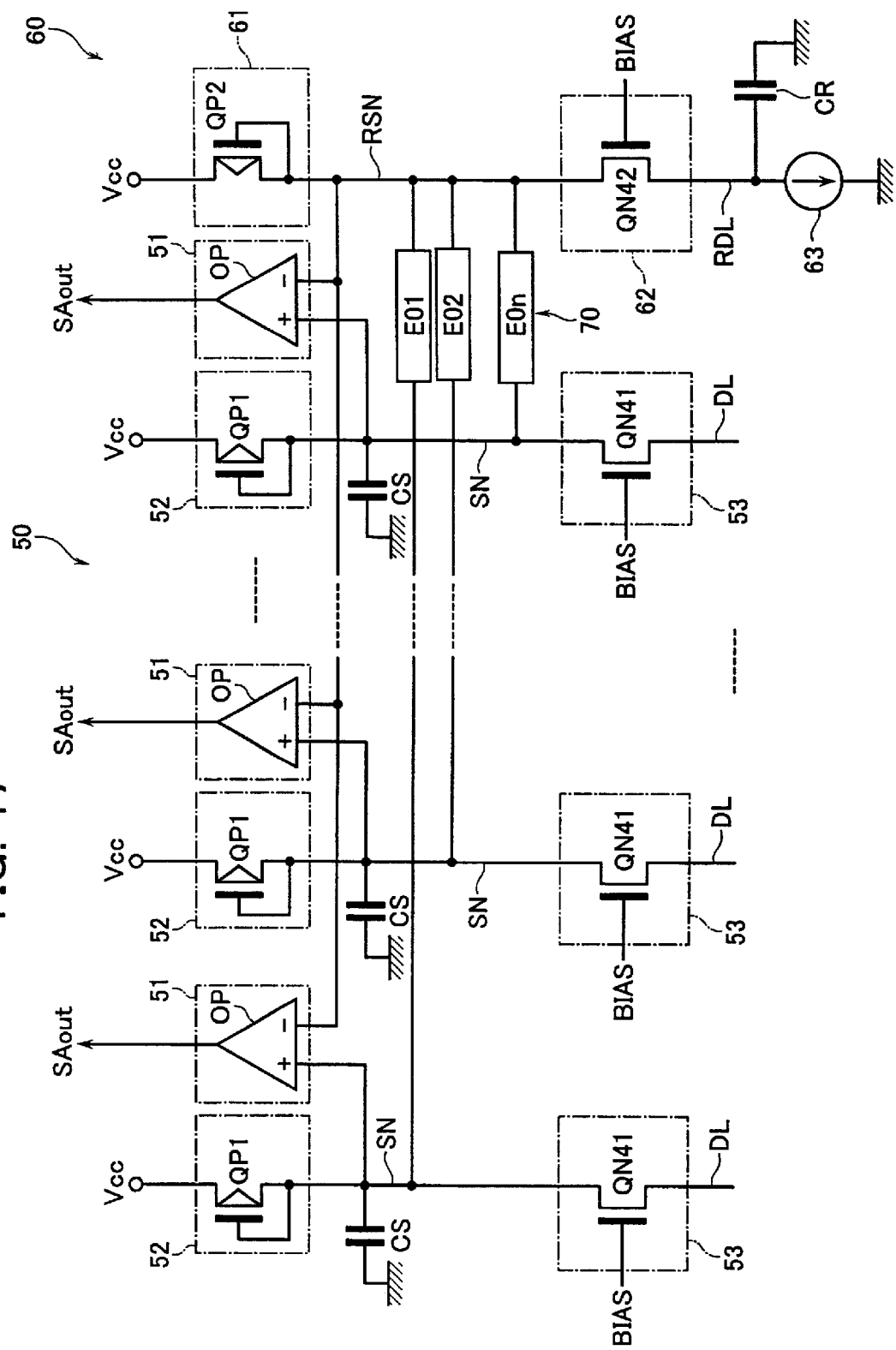
FIG. 17 is a diagram showing another configuration example of the sense amplifier circuitry with equalize circuits provided therein.

Circuitry with this point taken into consideration is shown in FIG. 17, which is similar in basic arrangement to that of FIG. 16 with a dummy sense-line capacitor CS being added to each sense line SN. In this way, the capacitance of sense line SN is intentionally made larger in a way virtually proportional to a capacitance increase resulted from connection of multiple sense amplifiers to the reference sense line RSN, thereby causing sense line SN and reference sense line RSN to be substantially the same in capacitance as each other.

Figure 18:
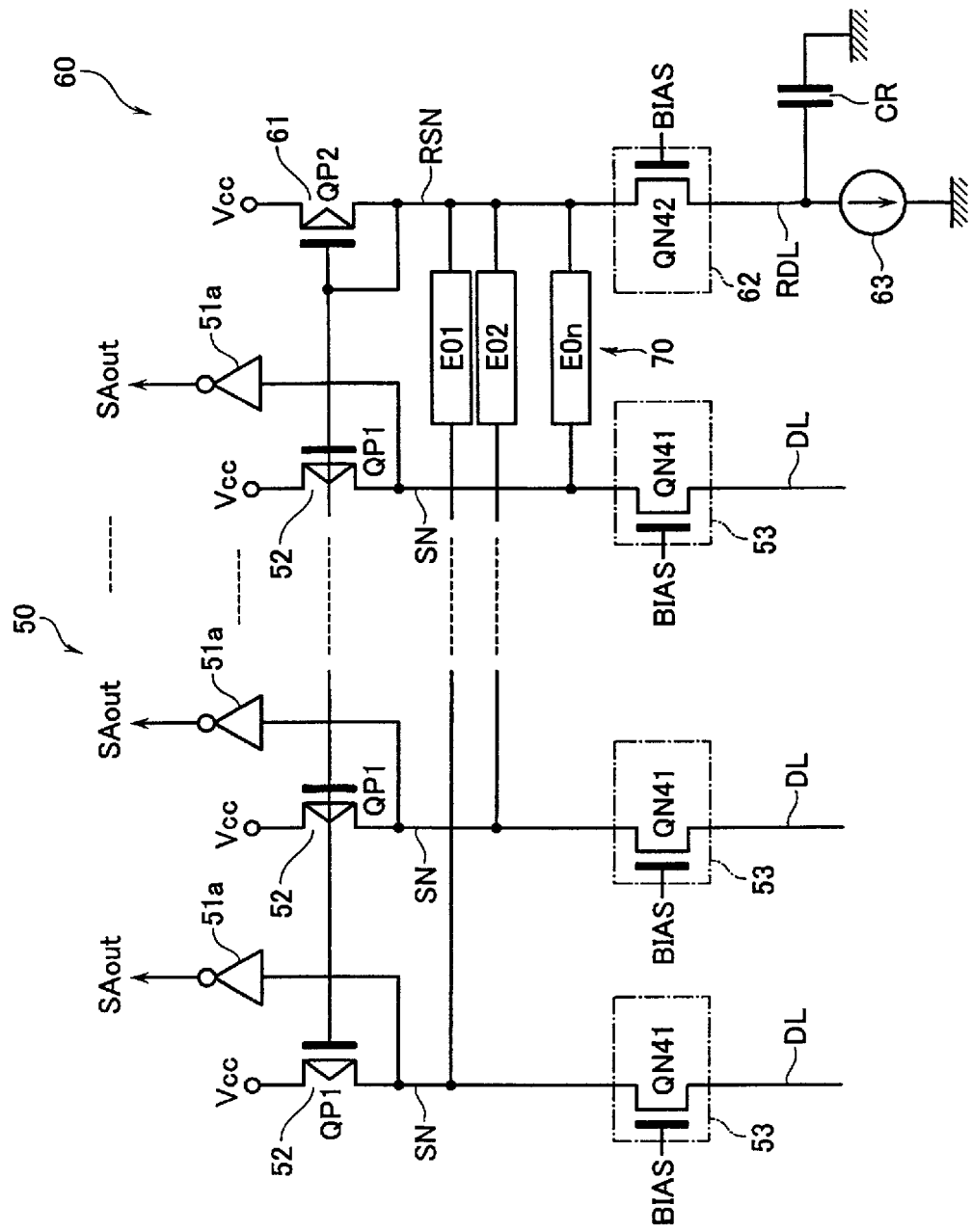
FIG. 18 is a diagram showing still another configuration example of the sense amplifier circuitry with equalize circuits provided therein.

Another exemplary circuit is shown in FIG. 18, which is almost similar in basic configuration to that of FIG. 6 with n equalize circuits E01, E02, ..., E0n being interposed between respective sense lines SN of sense amplifier array 50 and their common reference sense line RSN, the sense-amp array 50 using inverters 51a as the core elements of sense amplifiers.

Figure 19:
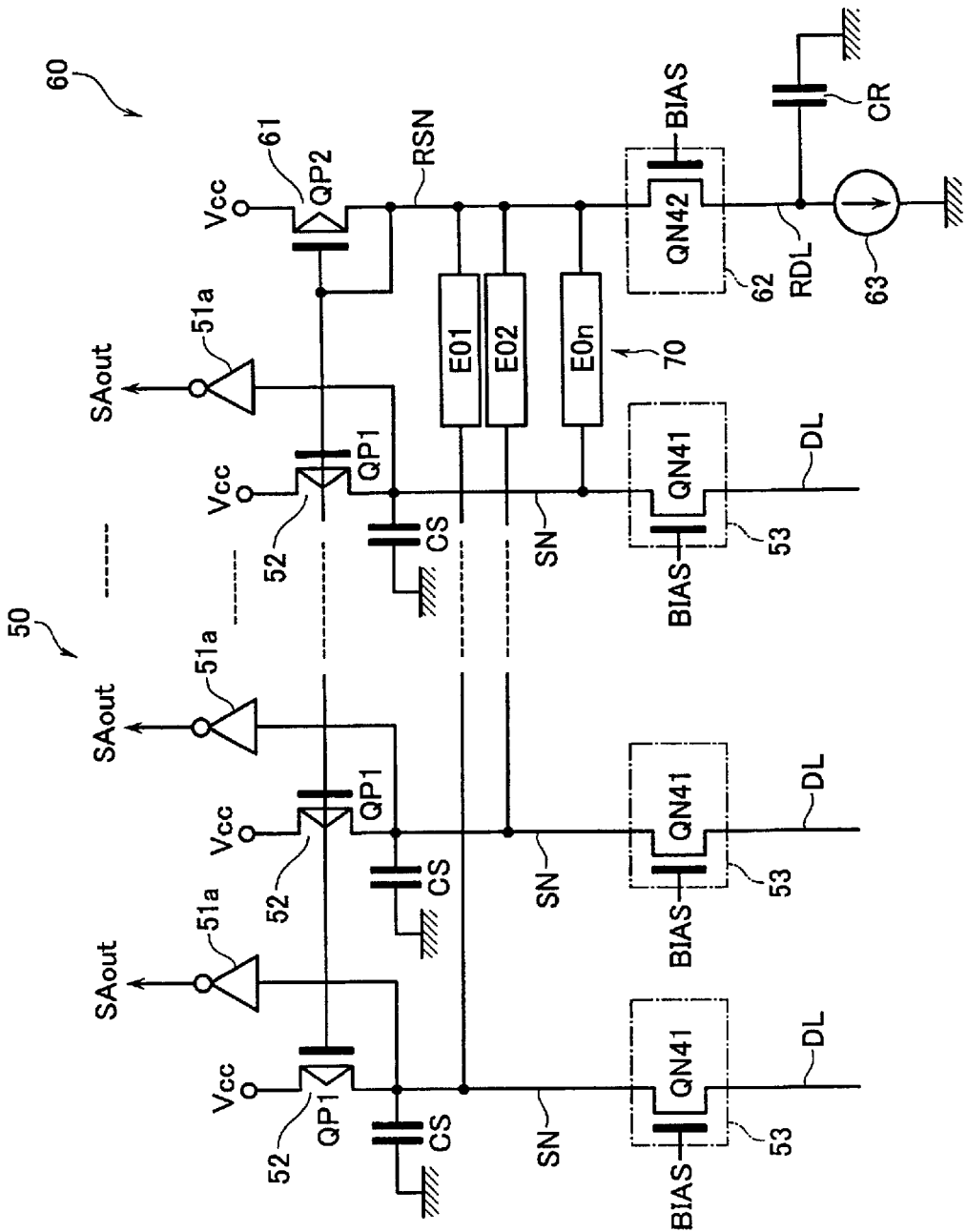
FIG. 19 is a diagram showing yet another configuration example of the sense amplifier circuitry with equalize circuits provided therein.

Still another exemplary circuit is shown in FIG. 19, which is similar in basic arrangement to that of FIG. 18 with a dummy sense line capacitor CS being added to each sense line SN as in the example of FIG. 17 to thereby ensure that the sense line SN and the reference sense line RSN are substantially the same in capacitance as each other.

Figure 20:
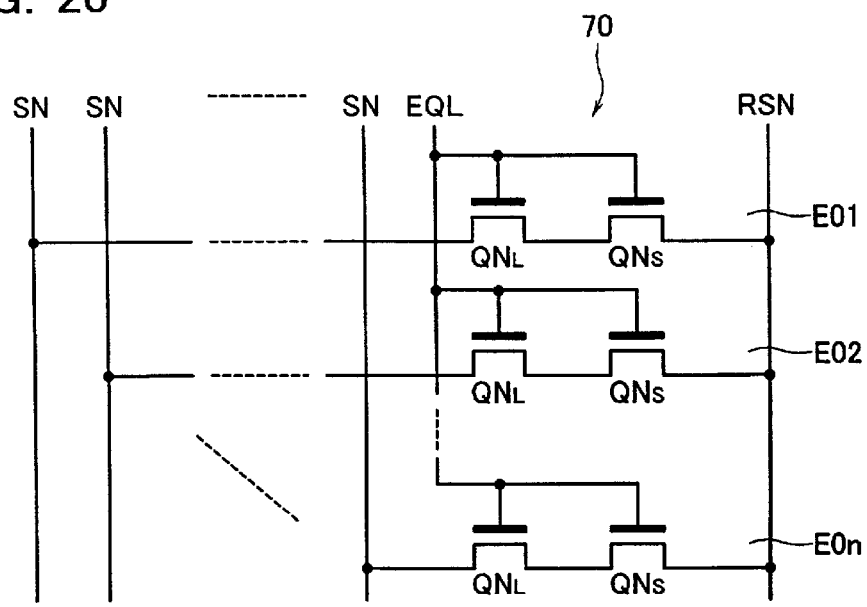
FIG. 20 is an equivalent circuit showing a configuration example of equalize circuits.

A detailed internal configuration of the equalize circuit assembly 70 of FIGS. 16–19 is shown in FIG. 20. As shown herein, each equalize circuit E01, E02, ..., E0n is formed of a serial combination of two NMOS transistors $QN_L$, $QN_S$. These NMOS transistors $QN_L$, $QN_S$ have their gates that are simultaneously controlled in response to receipt of an equalize signal EQL. NMOS transistor $QN_L$ is connected at its one end to a corresponding sense line SN whereas NMOS transistor $QN_S$ is coupled at one end to reference sense line RSN. Suppose here that NMOS transistor $QN_L$ is greater in gate area than NMOS transistor $QN_S$. An example is that in case reference sense line RSN is commonly used or shared by n sense lines SN, the gate area of NMOS transistor $QN_L$ is n times greater than that of NMOS transistor $QN_S$.

Figure 21:
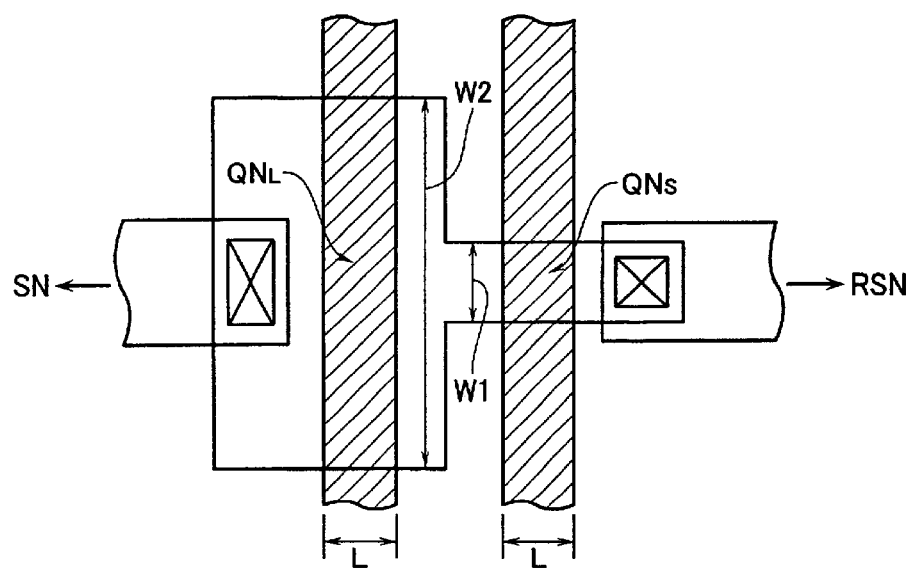
FIG. 21 is a diagram showing an equalize circuit layout pattern.

A layout example of such equalize circuit is shown in FIG. 21. As shown, the two NMOS transistor $QN_L$, $QN_S$ are designed so that while these have the same channel length L, they satisfy a relation which follows: W2=n×W1, where W1 is the channel width of NMOS transistor $QN_S$, and W2 is the channel width of NMOS transistor $QN_L$.

Figure 22:
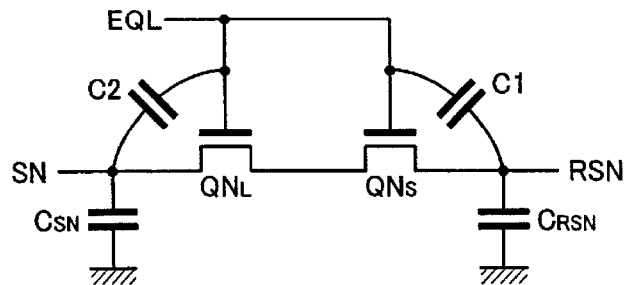
FIG. 22 is a diagram for explanation of switching noises due to the equalize circuit.

As apparent from the foregoing discussion, differing the transistor sizes of an equalize circuit when looking at from each sense line SN and the reference sense line RSN makes it possible to suppress or minimize the influence of switching noises occurring due to a difference in equalize circuit number as looked at from each sense line SN and reference sense line RSN. As shown in FIG. 22, a coupling capacitance C1 between the gate of NMOS transistor $QN_S$ and reference sense line RSN and a coupling capacitance C2 between the gate of NMOS transistor $QN_L$ and sense line SN are defined as C2=n·C1 from the gate area difference between the transistors. On the other hand, a capacitance C1 due to n equalize circuits is coupled to reference sense line RSN. In brief, the capacitive coupling from the gate to sense line SN is done via the single large capacitance C2 whereas the capacitive coupling is done to reference sense line RSN via n small capacitance components C1.

Accordingly, the use of the equalize circuit having a combination of MOS transistors with the above-noted gate area ratio makes it possible to force switching noises being applied to the sense line SN and reference sense line RSN to have substantially the same significance upon release or completion of the equalization. In other words, the intended potential difference is held between sense line SN and reference sense line RSN without regard to any switching noises. The result is that unlike the prior art, any appreciable data sense delays no longer occur thus enabling high-speed access, the sense delays otherwise occurring due to switching noise-caused reversal or inversion of the sense line SN and reference sense line RSN voltage differential.

Additionally, a coupling noise to the interconnection node of the two NMOS transistors $QN_S$, $QN_L$ will hardly be transferred externally because both of them are driven to turn off at a time.

Figure 23:
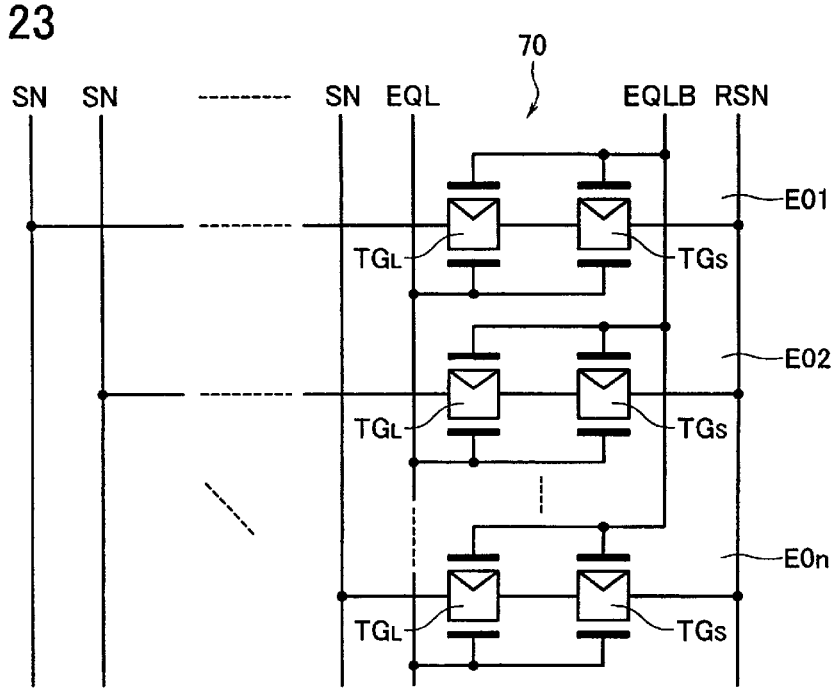
FIG. 23 is a diagram showing another example of equalize circuit configuration.

Another configuration example of the equalize circuit assembly 70 is shown in FIG. 23. Unlike the circuit of FIG.

20, this circuit is such that a respective one of the equalize circuits E01, E02, ..., E0n is formed of a serial combination of two CMOS transfer gates $TG_L$, $TG_S$, each having a parallel connection of an NMOS transistor and a PMOS transistor. A gate on the NMOS transistor side and a gate on the PMOS transistor side are controlled by complementary equalize signals EQL, EQL(Bar)—the latter will be abbreviated as "EQLB" for typographical purposes only. As in the case of unitary transistor use designs, CMOS transfer gate $TG_L$ being connected to a sense line SN is n times greater in gate area than CMOS transfer gate $TG_S$ coupled to reference sense line RSN.

Theoretically, in the case of using as the equalize circuit the above serial-connected two CMOS transfer gates $TG_L$, $TG_S$, any switching noises such as those explained in the prior art are no longer generated as far as the NMOS transistor and PMOS transistor driven to turn on and off simultaneously. This can be said because when one equalize signal EQL potentially changes from "H" to "L" level, the other equalize signal EQLB behaves to change from "L" to "H" level, whereby their capacitive couplings are mutually canceled out to countervail each other. However, since the equalize signals EQL, EQLB are customarily generated from a fundamental or "basic" timing signal through gates different in stage number from each other resulting in creation of a difference in timing between switching operations of the both, the technique for serially connecting two gate area-different transistors together becomes effective even in case such CMOS transistor gates are used.

Figure 24:
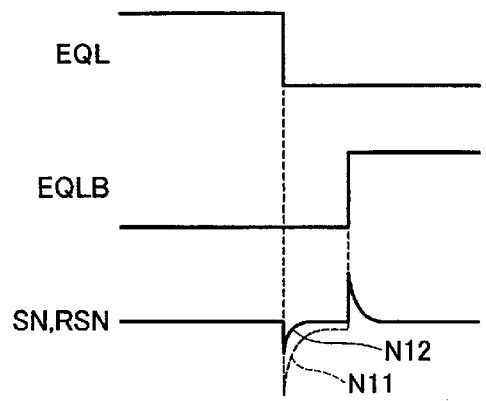
FIG. 24 is a diagram for explanation of switching noises of an equalize circuit shown in FIG. 23.

Unfortunately the use of such CMOS transfer gates $TG_L$, $TG_S$ is encountered with another problem occurring due to timing differentials between the equalize signals EQL, EQLB. As shown in FIG. 24 the equalize signal EQLB can often experience a delay in transition from "H" to "L" level with respect to the equalize signal EQL's "H" to "L" transition. This transition delay causes the CMOS transfer gates $TG_L$, $TG_S$ to undergo creation of a time period in which the PMOS transistor does not turn off even when NMOS transistor turns off.

Figure 25:
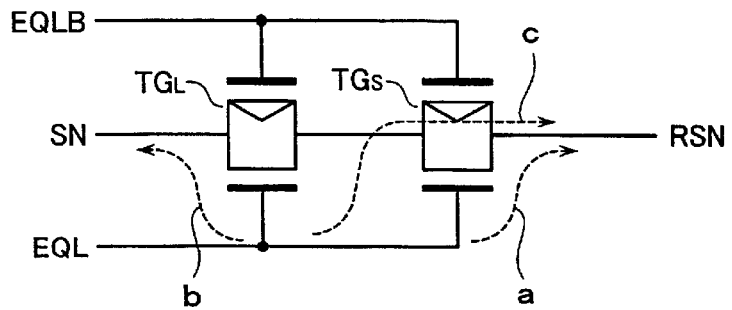
FIG. 25 is a diagram showing typical behavior of switching noises generated.

In such case, as shown in FIG. 25, when switching noises a, b ride on the reference sense line RSN and sense line SN from the gates of NMOS transistors of the CMOS transfer gates $TG_L$, $TG_S$, noises coming from n equalize circuits which are coupling to a connection node of two transfer gates from the gate of larger transfer gate $TG_L$ are transferred as a noise c toward the reference sense line RSN through the PMOS transistor of transfer gate $TG_S$ that is not turned off yet.

Although a noise coupling to the connection node of two transfer gates from the gate of smaller transfer gate $TG_S$ also is sent to the sense line SN through the PMOS transistor of the transfer gate $TG_L$ that is not yet turned off, this noise is negligible in significance as compared to the noise c. This can be said because the gate area is small. Another reason is that a single equalize circuit alone is connected to each sense line SN.

The result is that as shown in FIG. 24, a switching noise N11 appearing on the reference sense line RSN becomes greater than a switching noise N12 on sense line SN.

Figure 26:
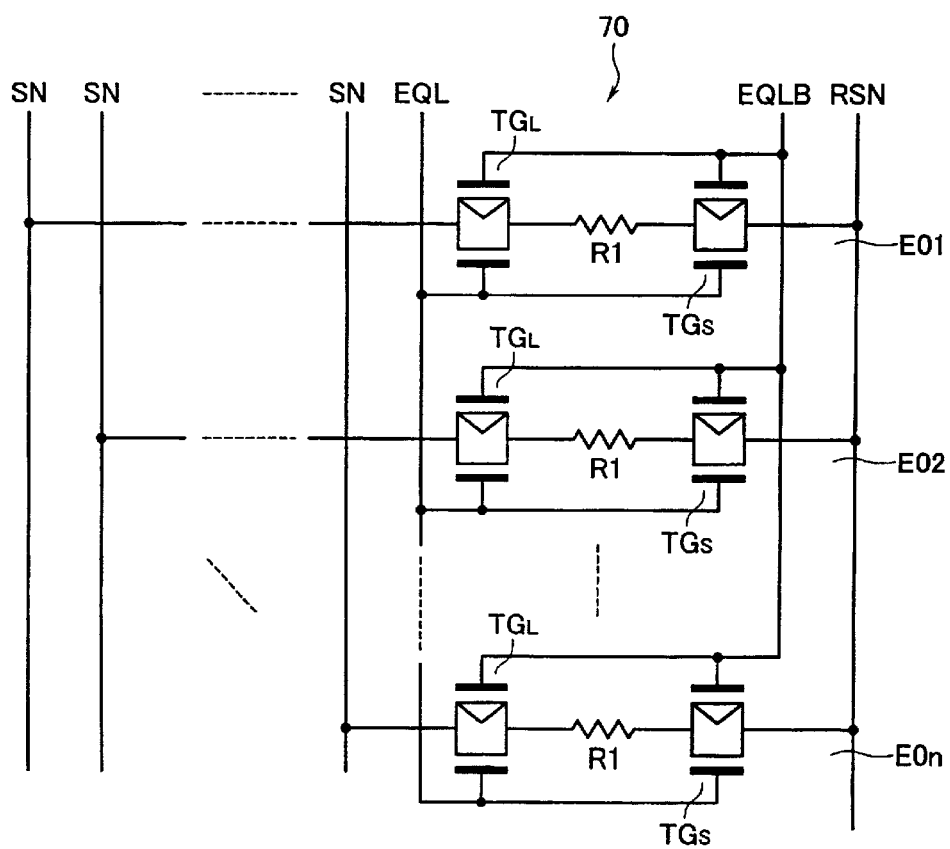
FIG. 26 is a diagram showing a configuration example of equalize circuitry with an improved arrangement of that shown in FIG. 23.

For this kind of switching noises occurring due to timing differences between the equalize signals EQL, EQLB, it is effective to additionally connect a resistor R1 between the two CMOS transfer gates $TG_L$, $TG_S$ as shown in FIG. 26. This makes it possible to reduce the leakage noise c as discussed in conjunction with FIG. 25.

Figure 27:
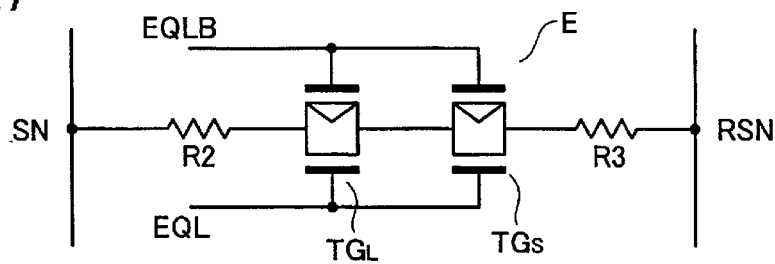
FIG. 27 is a diagram showing another configuration example of equalize circuitry with an improved arrangement of that in FIG. 23.

Another effective scheme is shown in FIG. 27, wherein a resistor R2 is inserted between one transfer gate $TG_L$ and its associated sense line SN while providing a resistor R3 between the other transfer gate $TG_S$ and reference sense line RSN. With such an arrangement, it becomes possible to suppress the leakage noise c occurring due to the equalize signal timing difference stated previously in conjunction with FIG. 25 and also possible to reduce the noises a, b directly coupling to the reference sense line RSN and sense line SN from respective gates.

Examples of the resistors R1 to R3 shown in FIGS. 26–27 include but not limited to diffusion layer resistors, polysilicon film resistors, and constant gate-voltage MOS transistors. Attention should be taken here to the fact that these resistors R1–R3 are incapable of having excessively large resistance values since the use of too large resistance values can limit the functionality of the equalize circuits.

The switching noises reduction scheme using more than one resistor shown in FIG. 26 or 27 is also applicable to circuitry with a serial connection of two MOS transistors of one chosen channel type as explained in FIG. 20. For instance, the resistor-based noise reduction technique may offer significant effects in cases where a timing difference occurs even when the two MOS transistors are spaced apart from each other for on-chip layout and controlled by the same equalize signal.

As previously stated, in case the equalize circuits are configured from transfer gates, switching noises inherently pose no specific problems as long as both the PMOS transistor and the NMOS transistor are driven to turn on and off at a time in a synchronized fashion. An embodiment designed by taking account of this point will be set forth below.

Figure 28:
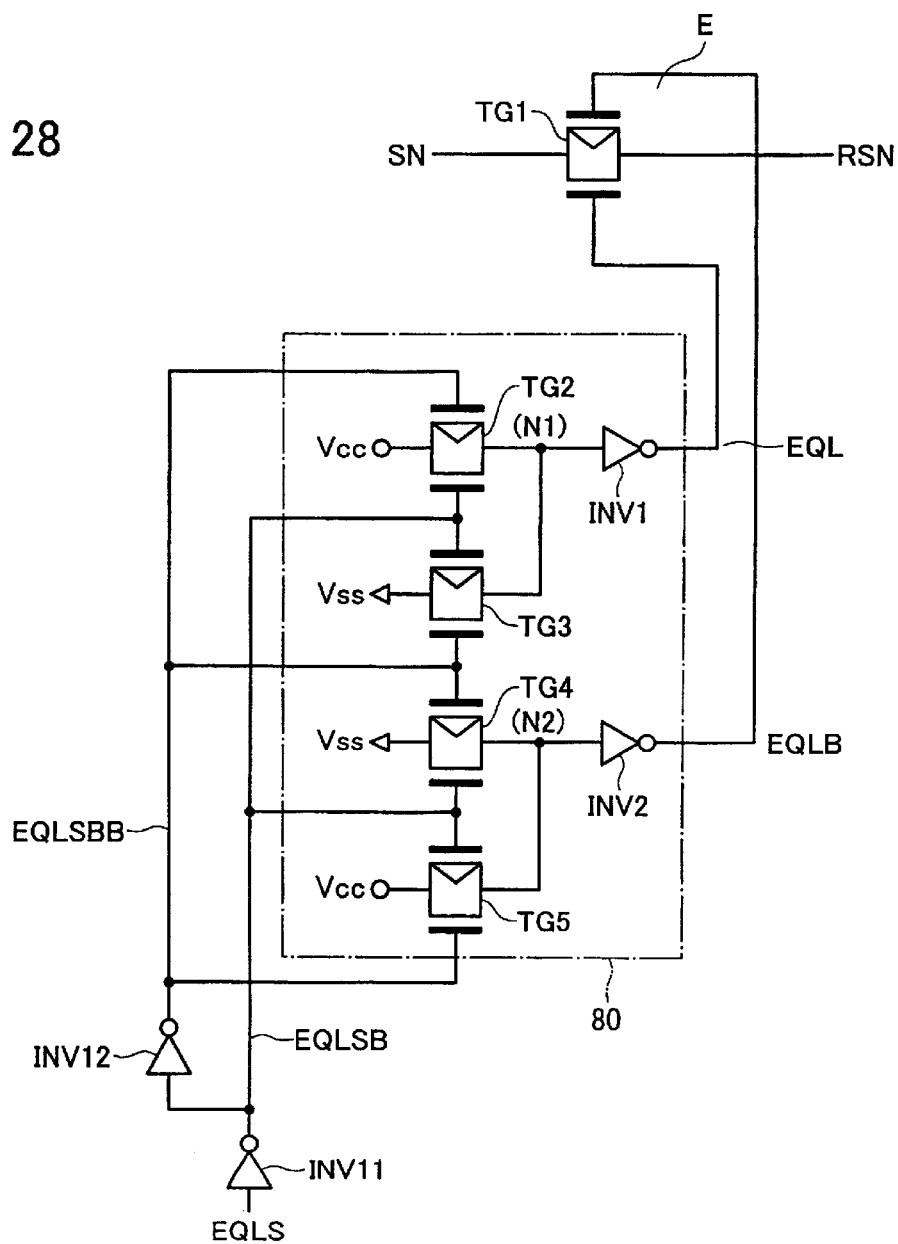
FIG. 28 is a diagram showing a configuration example of equalize circuitry in accordance with another embodiment of the invention.

See FIG. 28. This diagram depicts exemplary circuitry which includes an equalize circuit E with a single CMOS transfer gate TG1 interposed between a sense line SN and a reference sense line RSN. The circuitry also includes a timing control circuit 80. This controller 80 is operatively responsive to receipt of a fiducial or "standard" timing signal EQLS for generating and issuing equalize signals EQL and EQLB. Equalize signal EQL is used to drive a gate of CMOS transfer gate TG1 on the NMOS transistor side. Equalize signal EQLB is for driving a PMOS transistor side gate of CMOS transfer gate TG1. Very importantly, timing controller 80 generates equalize signals EQL, EQLB based on standard timing signal EQLS in such a manner that no appreciable timing differences are present between signals EQL, EQLB.

To this end, the timing controller 80 of FIG. 28 has two CMOS transistor pairs: a pair of CMOS transfer gates TG2, TG3 for generation of the equalize signal EQL, and another pair of CMOS transfer gates TG4, TG5 for generation of equalize signal EQLB. The transfer gates TG2–TG3 forming one pair have certain ends connected to an on-chip supply voltage Vcc and ground potential Vss respectively and also have the other ends as common-coupled together to a circuit node N1. This node N1 is for use as a terminal for output of equalize signal EQL through an inverter INV1 connected thereto. The remaining transfer gates TG2–TG3 forming the other pair have certain ends connected to the supply voltage Vcc and ground voltage Vss respectively and the other ends coupled together to a node N2. This node N2 is a terminal for outputting equalize signal EQLB via an inverter INV2.

NMOS transistors of the CMOS transfer gates TG2, TG4 and PMOS transistors of the CMOS transfer gates TG3, TG5 have their gates which are driven by a signal EQLSB that is an inverted version of the standard timing signal EQLS by inverter INV11. PMOS transistors of transfer gates TG2, TG4 and NMOS transistors of transfer gates TG3, TG5 have gates which are driven by a signal EQLSBB that is a further inverted version of the signal EQLSB by inverter INV12. Inverters INV1, INV2 derive output signals EQLSB, EQLSBB for use as the equalize signals EQL, EQLB for driving the gates of NMOS and PMOS transistors of CMOS transfer gate TG1, respectively.

Figure 29:
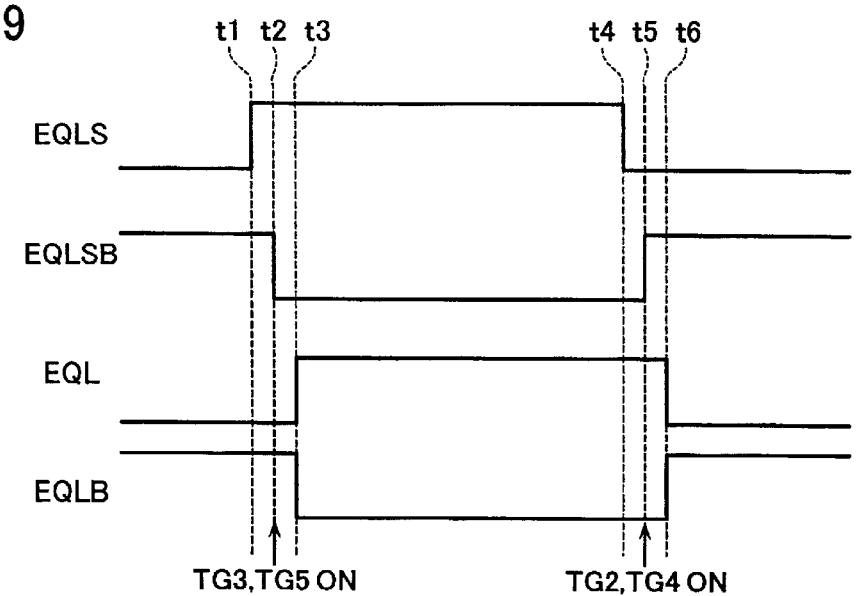
FIG. 29 is a timing diagram for explanation of an operation of the equalize circuitry of FIG. 28.

Using the timing controller circuit 80 of FIG. 28 makes it possible to obtain from the standard timing signal EQLS the equalize signals EQL, EQLB which complementarily change in potential between "H" and "L" levels with the same logic gate stage number. A typical example of such complementary level transition pattern is shown in FIG. 29. As shown herein, when the standard timing signal EQLS potentially rises up at a time point t1, the signal EQLSB reaches "L" level at a time point t2 with a slight time lag therefrom. Whereby, the transfer gates TG2, TG4 that have been turned off begin to turn off whereas the transfer gates TG3, TG5 turn on simultaneously.

Although at this time the transfer gates TG3, TG5 are such that the PMOS transistor and NMOS transistor might undergo a deviation in turn-on timing, if the PMOS transistor turns on then the voltages Vss, Vcc are supplied to the input nodes N1, N2 of inverters INV1, INV2 respectively, causing at instant t3 the equalize signal EQL to potentially go high while letting the equalize signal EQLB go low—i.e. EQL="H" and EQLB="L." To be brief, with this timing controller 80, there is no difference between the gate stage number within a time period of from the potential rise-up of standard timing signal EQLS and rise-up of equalize signal EQL and that within a time period up to the potential drop of equalize signal EQLB.

The same goes with the event that the equalize signal EQL potentially transitions from "H" to "L" level. More specifically, the standard timing signal EQLS potentially drops down to "L" at instant t4; with a slight delay therefrom, the transfer gates TG2, TG4 turn on simultaneously at instant t5. Thus the voltages Vcc, Vss are supplied to the input terminal of inverters INV1, INV2, resulting in establishment of EQL="H" and EQLB="L" at instant t6. At this time also, any timing deviation or "offset" is absent.

The result is that the equalize signals EQL, EQLB with no timing offsets are given to the transfer gate TG1 of equalize circuit E, which in turn ensures that none of the sense line SN and reference sense line RSN suffer from switching noises.

Optionally in case the transfer gates TG2 to TG5 are sufficiently large in current drivability, the inverters INV1, INV2 may be omitted causing the nodes N1, N2 to be used directly as the output terminals of the equalize signals EQL, EQLB.

Figure 30:
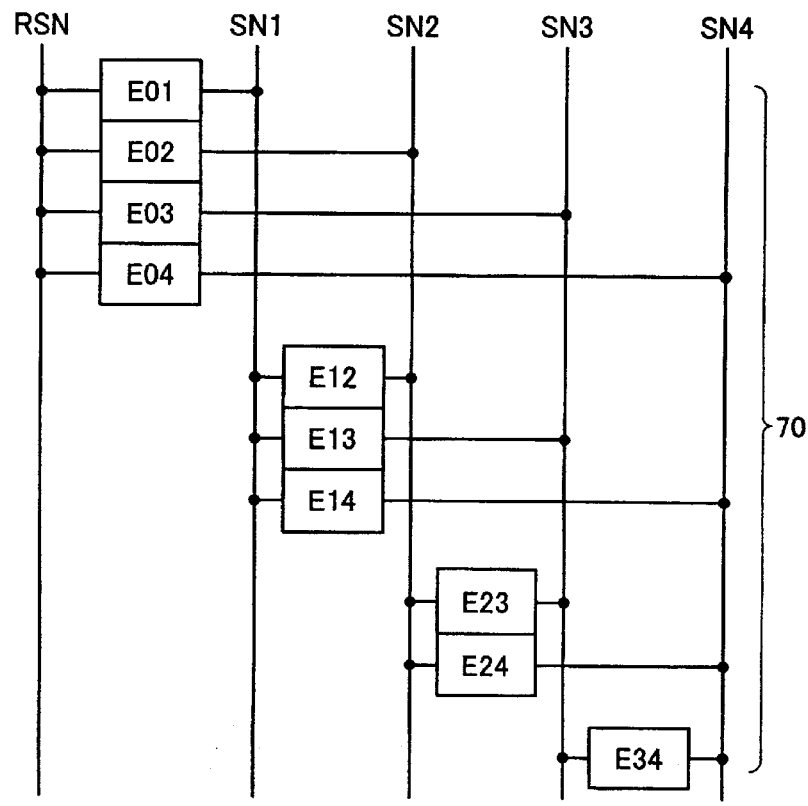
FIG. 30 is a diagram showing a configuration example of equalize circuitry in accordance with a further embodiment of the invention.

An equalize circuit group 70 in accordance with a further another embodiment of the invention is shown in FIG. 30. In this embodiment a single reference sense line RSN and a respective one of multiple sense lines SN sharing this line RSN are made equal to each other in number of equalize circuits connected thereto. More specifically the circuitry of FIG. 30 employs four sense lines SN1 to SN4. In responding thereto, four equalize circuits E01 to E04 are provided between the reference sense line RSN and respective sense lines SN1–SN4. In addition, equalize circuits E12, E13, E14 are provided between the sense line SN1 and the remaining sense lines SN2–SN4 with equalize circuits E23, E24 being provided between sense line SN2 and sense lines SN3–4 and also with an equalize circuit E34 provided between sense lines SN3 and SN4.

Connecting identically the same number—here, four—of equalize circuits to any one of the reference sense line RSN and each sense line SN in this way ensures that when all the equalize circuits E01–04, E12–14, E23–24 and E34 are controlled to simultaneously turn on and off in the equalize circuit group 70, resultant switching noises expected to appear on the reference sense line RSN and each sense line SN become the same as each other upon releasing of the equalization. Accordingly, even where this equalize circuit group 70 is designed to use prior known equalize circuit configurations, no switching noise-caused delays occur during sense operations.

The above-stated equalize circuits using MOS transistor pairs or CMOS transfer gates are such that one end is connected to a sense line SN whereas the other end is to reference sense line RSN. It would readily occur to those skilled in the art that equalize circuits are the ones that set sense lines SN and reference sense line RSN at the same potential level to thereby set data lines DL being connected to the sense lines SN and a reference data line RDL as coupled to the reference sense line RSN also at the same potential level. In this respect, the equalize circuits are modifiable in layout locations in such a way that an equalize circuit is connected between each data line DL and reference data line RDL.

Figure 31:
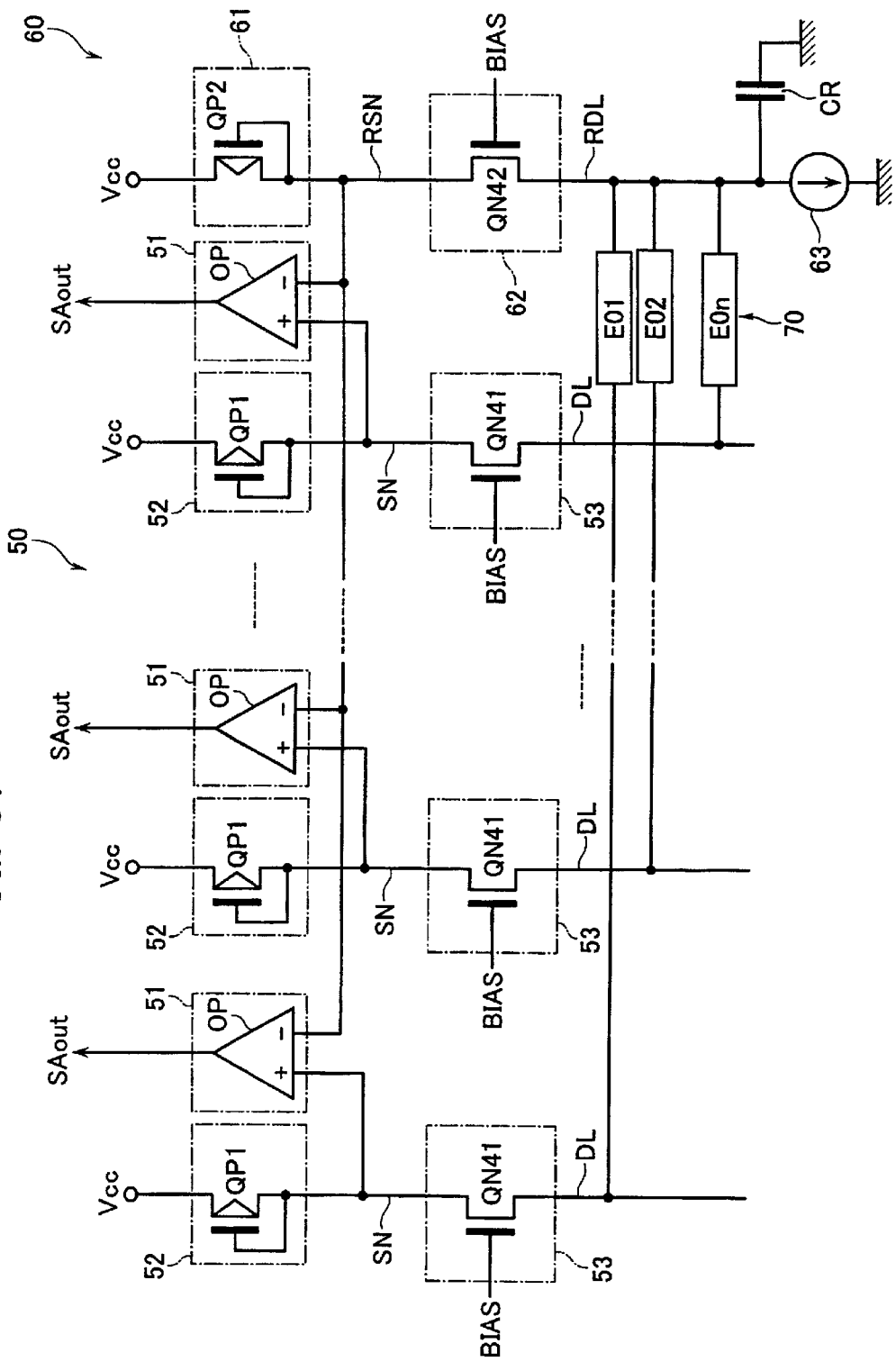
FIG. 31 is a diagram showing a configuration example of sense amplifier circuitry equipped with equalize circuits.

An example is that as shown in FIG. 31, the circuit configuration of FIG. 16 may be altered so that each equalize circuit E01, E02, . . . , E0n is connected at its one end to a data line DL and coupled at the other end to a reference data line RDL. Although not specifically depicted, the circuit layouts of FIGS. 17–19 are alterable similarly. As per the embodiments shown in FIGS. 20–30, similar results are obtainable even when their sense lines SN and reference sense line RSN are alternatively read or interpreted as data lines DL and reference data line RDL respectively.

This invention should not be limited only to the above stated embodiments. For example, although the above embodiments are illustratively directed to flash memory devices of the NOR type, the principles of the invention may also be applicable with no specific changes or modifications to other various types of semiconductor memory devices which include current pull-in type memory cells and employ current detection type sense amplifiers.

It should also be noted that although page mode-built flash memories have been explained in the above embodiments, this invention is also applicable to flash memories with burst mode functionalities as these also require layout of a great number of sense amplifiers therein. In this case, letting the burst-mode flash memories be equipped with a clock-driven shift register makes it possible to serially output data as latched at a page buffer by parallel-to-serial conversion in the shift register.

Further note that in view of the fact that the equalize circuits E of FIGS. 27 and 28 are of the type capable of suppressing switching noises per se, this invention is also applicable to semiconductor memory chips of the type using a sense line and a reference sense line which are prepared so that these are paired with a ratio of "1:1," without offering built-in page mode and burst mode operabilities. Furthermore, the scheme of FIG. 27 is also employable effectively in cases where a single equalizing MISFET or a single equalizing CMOS transfer gate is employed.

Lastly this invention is similarly applicable to even non-page/burst mode semiconductor memories as far as these comprise an increased number of sense amplifiers disposed therein for permitting parallel transfer of multiple data bits.

Although the invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

What is claimed is:

1. A semiconductor memory device comprising:
an array of memory cells each of which stores data depending on whether a current pull-in is present or absent or whether the current pull-in is large or small;
a plurality of sense lines to which read data of said array of memory cells is transferred;
a reference sense line commonly used to sense data at said plurality of sense lines while being given a reference voltage for data sensing; and
a sense amplifier array having a plurality of sense amplifiers configured to amplify a differential voltage between said plurality of sense lines and said reference sense line to thereby determine read data,
wherein each sense amplifier of said plurality of sense amplifiers is connected to both a corresponding sense line of said plurality of sense lines and said reference sense line.

2. The semiconductor memory device according to claim 1, wherein a dummy sense line capacitance is connected to each said sense line for establishing a capacitive valance relative to said reference sense line.

3. The semiconductor memory device according to claim 1, wherein said sense amplifier array comprises:
a plurality of differential amplifiers having first input terminals connected to said sense lines respectively and second input terminals commonly connected together to said reference sense line, each said differential amplifier serving as a sense amplifier core circuit;
a plurality of first current-source loads configured to current supply to each said sense line; and
a second current-source load configured to current supply to said reference sense line.

4. The semiconductor memory device according to claim 1, wherein said sense amplifier array comprises:
a plurality of inverters having input terminals connected to said plurality of sense lines respectively and serving as sense amplifier core circuits;
a first current-source transistor, a gate and drain of which are commonly-coupled together for current supplying to said reference sense line; and
a plurality of second current-source transistors each of which makes up a current mirror together with the first current-source transistor for current supplying to respective ones of said sense lines.

5. The semiconductor memory device according to claim 1, wherein said sense lines are respectively connected through first separation circuits to data lines with read data of said memory cell array being output thereto, and wherein
said reference sense line is connected through a second separation circuit to a reference data line for giving said reference voltage to said reference sense line.

6. The semiconductor memory device according to claim 5, wherein said first and second separation circuits are driven by a common bias voltage generating circuit.

7. The semiconductor memory device according to claim 1, wherein said sense amplifier array includes a first sense amplifier array having m (where "m" is an integer greater than or equal to 2) sense amplifiers and a second sense amplifier array having n (where "n" is an integer more than or equal to 2 and yet less than m) sense amplifiers.

8. The semiconductor memory device according to claim 7, wherein said memory cell array has a normal cell array and a redundant cell array for replacement of a defective cell or cells in said normal cell array, and wherein
said first sense amplifier array is used for data sensing of said normal cell array whereas said second sense amplifier array is used for data sensing of said redundant cell array.

9. The semiconductor memory device according to claim 7, wherein first dummy sense line capacitors are connected to the respective sense lines of said first sense amplifier array for establishing a capacitive valance relative to a first reference sense line as commonly used to perform data sensing at said sense lines of said first sense amplifier array, and
second dummy sense line capacitors are connected to the respective sense lines of said second sense amplifier array for establishing a capacitive valance relative to a second reference sense line as commonly used to perform data sensing at said sense lines of said second sense amplifier array.

10. The semiconductor memory device according to claim 9, wherein third dummy sense line capacitors are connected to the respective sense lines of said second sense amplifier array and said second reference sense line for establishing a capacitive valance relative to each sense line of said first sense amplifier array and said first reference sense line.

11. The semiconductor memory device according to claim 3, wherein said first and second current-source loads are made up of transistors having a gate area greater than a gate area of an input stage transistor of each said differential amplifier.

12. The semiconductor memory device according to claim 4, wherein the first and second current-source transistors have a gate area greater than a gate area of said inverters.

13. The semiconductor memory device according to claim 1 wherein a sense line charge acceleration circuit is connected to each said sense line for accelerating charging of the sense line.

14. The semiconductor memory device according to claim 1, wherein said memory cells are electrically rewritable non-volatile memory cells each having a MISFET structure with a charge storage layer and a control gate multilayered.

15. A semiconductor memory device comprising:
an array of memory cells each of which stores data depending on whether current pull-in is present or absent or whether the pull-in current is large or small;
a plurality of sense lines to which read data of said array of memory cells is transferred;
a reference sense line commonly used to sense data at said plurality of sense lines while being given a reference voltage for data sensing;
a sense amplifier array having a plurality of sense amplifiers configured to amplify a differential voltage between said plurality of sense lines and said reference sense line to thereby determine read data; and
a plurality of equalize circuits configured to initialize each sense line of said plurality of sense lines and said reference sense line at an identical potential level,
wherein each sense amplifier of said plurality of sense amplifiers is connected to both a corresponding sense line of said plurality of sense lines and said reference sense line.

16. The semiconductor memory device according to claim 15, wherein said sense lines are respectively connected through first separation circuits to data lines with read data of said memory cell array being output thereto, said reference sense line is connected through a second separation circuit to a reference data line for giving said reference voltage to said reference sense line, and each said equalize circuit has a serial combination of first and second transistors between said sense lines and said reference sense line with said first transistor on said sense lines side having a gate area greater than a gate area of said second transistor on said reference sense line side.

17. The semiconductor memory device according to claim 15, wherein said sense lines are respectively connected through first separation circuits to data lines with read data of said memory cell array being output thereto, said reference sense line is connected through a second separation circuit to a reference data line for giving said reference voltage to said reference sense line, and each said equalize circuit has a serial combination of first and second transistors between said data lines and said reference data line with said first transistor on said data lines side having a gate area greater than a gate area of said second transistor on said reference data line side.

18. The semiconductor memory device according to claim 16, wherein when said sense lines sharing said reference sense line are n lines (where "n" is an integer greater than or equal to 2), said first transistor has a gate area n times greater than a gate area of said second transistor.

19. The semiconductor memory device according to claim 16, wherein said first and second transistors are n-channel MISFETs.

20. The semiconductor memory device according to claim 17, wherein when said sense lines sharing said reference sense line are n lines (where n is an integer greater than or equal to 2), said first transistor has a gate area n times greater than a gate area of said second transistor.

21. The semiconductor memory device according to claim 17, wherein said first and second transistors are n-channel MISFETs.

22. The semiconductor memory device according to claim 15, wherein said sense amplifier array comprises:

a plurality of differential amplifiers having first input terminals connected to said sense lines respectively and second input terminals commonly connected together to said reference sense line, each said differential amplifier serving as a sense amplifier core circuit;

a plurality of current-source loads for supplying a current to each said sense line; and a second current-source load for current supply to said reference sense line.

23. The semiconductor memory device according to claim 15, wherein said sense amplifier array comprises:

a plurality of inverters having input terminals connected to said plurality of sense lines respectively and each serving as a sense amplifier core circuit;

a first current-source transistor, a gate and drain of which are commonly connected together for current supplying to said reference sense line; and a plurality of second current-source transistors making up current mirror together with said first current-source transistor for current supplying to each said sense line.

24. The semiconductor memory device according to claim 15, wherein said sense lines are respectively connected through first separation circuits to data lines with read data of said memory cell array being output thereto, said reference sense line is connected through a second separation circuit to a reference data line for giving said reference voltage to said reference sense line, and each said equalize circuit has a serial combination of first and second complementary metal oxide semiconductor (CMOS) transfer gates between said sense lines and said reference sense line.

25. The semiconductor memory device according to claim 15, wherein said sense lines are respectively connected through first separation circuits to data lines with read data of said memory cell array being output thereto, said reference sense line is connected through a second separation circuit to a reference data line for giving said reference voltage to said reference sense line, and each said equalize circuit has a serial combination of first and second CMOS transfer gates between said data lines and said reference data line.

26. The semiconductor memory device according to claim 24, wherein when said sense lines sharing said reference sense line are n lines (where n is an integer greater than or equal to 2), said first CMOS transfer gate on said sense lines side has a gate area n times greater than a gate area of said second CMOS transfer gate on said reference sense line side.

27. The semiconductor memory device according to claim 24, wherein a resistive element is interposed between said first and second CMOS transfer gates.

28. The semiconductor memory device according to claim 24, wherein a first resistive element is interposed between said first CMOS transfer gate and a corresponding sense line, and a second resistive element is interposed between said second CMOS transfer gate and said reference sense line.

29. The semiconductor memory device according to claim 25, wherein when said sense lines sharing said reference sense line are n lines (where n is an integer greater than or equal to 2), said first CMOS transfer gate on a corresponding data line side has a gate area n times greater than a gate area of said second CMOS transfer gate on said reference data line side.

30. The semiconductor memory device according to claim 25, wherein a resistive element is interposed between said first and second CMOS transfer gates.

31. The semiconductor memory device according to claim 25, wherein a first resistive element is interposed between said first CMOS transfer gate and a corresponding data line, and a second resistive element is interposed between said second CMOS transfer gate and said reference data line.

32. A semiconductor memory device comprising:

an array of memory cells each of which stores data depending on whether current pull-in is present or absent or whether the current pull-in is large or small;

a sense line configured to receive read data of said array of memory cells as transferred thereto;

a reference sense line with a reference voltage configured to sense data given thereto;

a sense amplifier configured to amplify a differential voltage between said sense line and said reference sense line to thereby determine the read data;

an equalizing MISFET interposed between said sense line and said reference sense line configured to initialize said sense line and said reference sense line at an identical potential level; and resistors interposed between said equalizing MISFET and said sense line and between said MISFET and said reference sense line.

33. The semiconductor memory device according to claim 32, wherein said memory cells are electrically rewritable nonvolatile memory cells each having a MISFET structure with a charge storage layer and a control gate stacked.

34. A semiconductor memory device comprising:
an array of memory cells each of which stores data depending on whether current pull-in is present or absent or whether the current pull-in is large or small;
a sense line configured to receive read data of said array of memory cells as transferred thereto;
a reference sense line with a reference voltage configured to sense data given thereto;
a sense amplifier configured to amplify a differential voltage between said sense line and said reference sense line to thereby determine the read data;
an equalize circuit interposed between said sense line and said reference sense line and formed of a CMOS transfer gate configured to initialize said sense line and said reference sense line at an identical potential level; and
a timing control circuit operatively responsive to receive a standard timing signal configured to generate, with an identical logic gate stage number, first and second equalize signals being in a complementary relation and being used to drive an n-channel side gate and a p-channel side gate of said CMOS transfer gate.

35. The semiconductor memory device according to claim 34, wherein said timing control circuit comprises:
first and second CMOS transfer gates having certain terminals common-connected to a first output terminal for use with the first equalize signal and the remaining terminals potentially fixed at a power supply voltage and a ground voltage respectively, configured to be complementarily driven based on said standard timing signal to thereby selectively output the power supply voltage and the ground voltage to said first output terminal; and
third and fourth CMOS transfer gates having certain terminals common-connected to a second output terminal for use with the second equalize signal and the remaining terminals potentially fixed at the ground voltage and the supply voltage respectively, configured to be driven based on said standard timing signal substantially simultaneously during activation of said first and second CMOS transfer gates respectively to thereby selectively output the ground voltage and the supply voltage to said second output terminal.

36. The semiconductor memory device according to claim 34, wherein said memory cells are electrically rewritable non-volatile memory cells each having a MISFET structure with a charge storage layer and a control gate stacked.

37. A semiconductor memory device comprising:
an array of memory cells each of which stores data depending on whether current pull-in is present or absent or alternatively whether the current pull-in is large or small;
a plurality of sense lines with read data of the array of memory cells sent thereto;
a reference sense line commonly used to sense data at said plurality of sense lines while being given a reference voltage for data sensing;
a sense amplifier array including a plurality of sense amplifiers configured to amplify a differential voltage between said plurality of sense lines and said reference sense line to thereby determine read data; and
a plurality of equalize circuits interposed between respective ones of said plurality of sense lines, and between a respective one of said plurality of sense lines and said reference sense line configured to initialize said plurality of sense lines and said reference sense line at an identical potential level.

38. The semiconductor memory device according to claim 37, wherein an identical number of more than one equalize circuit is connected to a respective one of said plurality of sense lines and said reference sense line.

39. The semiconductor memory device according to claim 37, wherein each of said plurality of sense lines is connected to the remaining sense lines through said equalize circuits whereas said reference sense line is connected to each said sense line through said equalize circuits.

40. The semiconductor memory device according to claim 37, wherein said memory cells are electrically rewritable non-volatile memory cells each having a MISFET structure with a charge storage layer and a control gate stacked.

41. A semiconductor memory device comprising:
an array of memory cells;
a plurality of sense lines connected to said array of memory cells;
a reference sense line having a reference voltage; and
a sense amplifier array having a plurality of sense amplifiers connected to said plurality of sense lines and said reference sense line,
wherein each sense amplifier of said plurality of sense amplifiers is connected to both a corresponding sense line of said plurality of sense lines and said reference sense line.

42. A semiconductor memory device comprising:
an array of memory cells;
a plurality of sense lines connected to said array of memory cells;
a reference sense line having a reference voltage;
a sense amplifier array having a plurality of sense amplifiers connected to said plurality of sense lines and said reference sense line; and
a plurality of equalize circuits configured to initialize each sense line of said plurality of sense lines and said reference sense line,
wherein each sense amplifier of said plurality of sense amplifiers is connected to both a corresponding sense line of said plurality of sense lines and said reference sense line.

* * * * *